US010732026B1

(12) United States Patent
Danenberg et al.

(10) Patent No.: US 10,732,026 B1
(45) Date of Patent: Aug. 4, 2020

(54) FIXTURE WITH BRACKETS, CROSSBAR MECHANISM, AND WEIGHING MODULE

(71) Applicant: AMAZON TECHNOLOGIES, INC., Seattle, WA (US)

(72) Inventors: Michael Nathan Danenberg, Seattle, WA (US); Jeffrey Kevin Feiereisen, Seattle, WA (US); Jacob Siegel, Southborough, MA (US); Brett Allen Skaloud, Seattle, WA (US); Thomas Duester, Seattle, WA (US); James Merton Tidman, Round Rock, TX (US); Dawn Marie Pfund, Shoreline, WA (US); Jeremy Samuel De Bonet, Southborough, MA (US); Nicholas McMahon, Bolton, MA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/629,531

(22) Filed: Jun. 21, 2017

(51) Int. Cl.
*G01G 21/23* (2006.01)
*G01G 19/52* (2006.01)
(Continued)

(52) U.S. Cl.
CPC .......... *G01G 19/52* (2013.01); *G01G 19/40* (2013.01); *G01G 21/00* (2013.01); *G01G 21/22* (2013.01); *G01G 21/23* (2013.01); *G06Q 10/087* (2013.01); *H01R 12/722* (2013.01); *H01R 12/725* (2013.01); *H01R 13/514* (2013.01);
(Continued)

(58) Field of Classification Search
CPC ...... H05K 5/0073; H05K 5/0204; H05K 7/18; H05K 7/183; H05K 7/14; H05K 7/1417; H05K 7/1438; H01R 12/722; H01R 12/725; H01R 13/514; A47B 96/027; A47B 96/028; A47B 57/045; A47B 57/06; A47B 57/16; A47B 57/20; A47B 57/30; A47B 57/42; A47B 57/52; H02J 1/00; G01G 19/4144; G01G 19/52; G01G 21/22; G01G 21/23; G01G 21/28; G01G 19/40; G01G 21/00; G06Q 10/087
See application file for complete search history.

(56) References Cited

U.S. PATENT DOCUMENTS 4,043,413 A * 8/1977 Schaenen ............... G01G 19/44
177/126
4,125,168 A * 11/1978 Ormond ............... G01G 3/1402
177/211
(Continued)

OTHER PUBLICATIONS

"Flexure Configurations: Bending Beams", Interface Force Measurement Solutions. Retrieved from the Internet: <URL:http://www.interfaceforce.com/index.php?mod=library&show=13>.
(Continued)

*Primary Examiner* — Randy W Gibson
(74) *Attorney, Agent, or Firm* — Lindauer Law, PLLC

(57) ABSTRACT

Shelves or other fixtures may be used to support items at a facility. Weighing modules including load cells may be used at the fixtures to acquire weight data indicative of changes to the fixture as items are added or removed from the fixture. Accessories such as trays, bins, hangers, and so forth may be attached to the load cells, allowing the fixtures to be easily reconfigured to accommodate items of different sizes.

20 Claims, 31 Drawing Sheets

(51) Int. Cl.
*G06Q 10/08* (2012.01)
*H01R 12/72* (2011.01)
*H01R 13/514* (2006.01)
*G01G 19/40* (2006.01)
*G01G 21/00* (2006.01)
*H05K 5/02* (2006.01)
*H02J 1/00* (2006.01)
*H05K 7/14* (2006.01)
*H05K 5/00* (2006.01)
*G01G 21/22* (2006.01)

(52) U.S. Cl.
CPC .............. *H02J 1/00* (2013.01); *H05K 5/0073* (2013.01); *H05K 5/0204* (2013.01); *H05K 7/14* (2013.01)

(56) References Cited

U.S. PATENT DOCUMENTS

| | | | | |
|---|---|---|---|---|
| 4,203,497 | A * | 5/1980 | Harris | G01G 19/025 177/134 |
| 4,236,190 | A * | 11/1980 | Hollingsead | H01R 13/193 361/724 |
| 4,766,517 | A * | 8/1988 | Abell | H05K 7/1412 138/173 |
| 4,884,645 | A | 12/1989 | Knothe et al. | |
| 4,939,622 | A * | 7/1990 | Weiss | H05K 7/1412 361/726 |
| 5,561,274 | A | 10/1996 | Brandorff | |
| 6,337,446 | B1 * | 1/2002 | Hulburt | G01G 19/44 177/126 |
| 6,544,052 | B1 * | 4/2003 | Schwartz | H05K 7/1412 361/798 |
| 6,566,613 | B1 * | 5/2003 | Gesuita | G01G 19/393 177/25.18 |
| 6,600,111 | B2 | 7/2003 | Simons | |
| 6,665,189 | B1 * | 12/2003 | Lebo | H01R 13/514 211/41.17 |
| 6,830,476 | B2 * | 12/2004 | Gesuita | H02J 1/00 177/25.18 |
| 7,225,980 | B2 | 6/2007 | Ku et al. | |
| 7,348,501 | B1 * | 3/2008 | Nugent, Jr. | G01G 21/23 177/126 |
| 7,639,505 | B2 * | 12/2009 | Chen | G06F 1/185 312/223.1 |
| 7,949,568 | B2 | 5/2011 | Fano et al. | |
| 8,009,864 | B2 | 8/2011 | Linaker et al. | |
| 8,113,431 | B2 * | 2/2012 | Gregerson | G06K 7/10722 235/462.43 |
| 8,189,855 | B2 | 5/2012 | Opalach et al. | |
| 8,630,924 | B2 | 1/2014 | Groenevelt et al. | |
| 9,235,928 | B2 | 1/2016 | Medioni et al. | |
| 9,354,105 | B2 * | 5/2016 | Kroll | G01G 21/28 |
| 9,473,747 | B2 | 10/2016 | Kobres et al. | |
| 9,557,209 | B2 * | 1/2017 | Savage | G01G 21/22 |
| 9,612,151 | B2 | 4/2017 | Tachibana | |
| 10,001,402 | B1 * | 6/2018 | Gyori | G06Q 10/087 |
| 10,064,502 | B1 * | 9/2018 | Gyori | A47F 5/16 |
| 10,121,121 | B1 * | 11/2018 | De Bonet | G06Q 10/087 |
| 10,168,202 | B2 | 1/2019 | Richards | |
| 10,466,095 | B1 * | 11/2019 | O'Neill et al. | G01G 21/23 |
| 2003/0111275 | A1 * | 6/2003 | Sternberg | G01G 19/445 177/144 |
| 2008/0178690 | A1 | 7/2008 | Simons | |
| 2011/0011936 | A1 | 1/2011 | Morandi et al. | |
| 2012/0284132 | A1 | 11/2012 | Kim et al. | |
| 2013/0284806 | A1 | 10/2013 | Margalit | |
| 2014/0201042 | A1 * | 7/2014 | Meyer | G06Q 10/087 705/28 |
| 2014/0263125 | A1 * | 9/2014 | Gonzalez | A47B 96/1408 211/134 |
| 2015/0075879 | A1 | 3/2015 | Sakai et al. | |
| 2015/0083503 | A1 | 3/2015 | Naidu | |
| 2015/0086107 | A1 | 3/2015 | Dedeoglu et al. | |
| 2018/0153312 | A1 * | 6/2018 | Buck | A47F 1/126 |
| 2018/0184803 | A1 * | 7/2018 | Bellar | A47B 96/061 |

OTHER PUBLICATIONS

"Flexure Configurations: Shear Beams", Interface Force Measurement Solutions. Retrieved from Internet: <URL:http://www.interfaceforce.com/index.php?mod=library&show=14>.

"Input/Output Characteristics and Errors", Interface Force Measurement Solutions. Retrieved from Internet: <URL:http://www.interfaceforce.com/index.php?mod=library&show=16>.

Asthana, et al., "An Indoor Wireless System for Personalized Shopping Assistance", CiteSeerX, In Proceedings of IEEE Workshop on Mobile Computing Systems and Applications, 1994. Retrieved from the Internet: <URL:http://citeseerx.ist.psu.edu/viewdoc/summary?doi=10.1.1.127.3033>.

Kalnikaite, et al., "How to Nudge in Situ: Designing Lambent Devices to Deliver Information Salience in Supermarkets", ACM, In proceeding of: UbiComp 2011: Ubiquitous Computing, 13th International Conference, UbiComp 2011, Beijing, China, Sep. 17-21, 2011. Retrieved from Internet: <URL:http://www.researchgate.net/publication/221568350_How_to_nudge_in_Situ_designing_lambent_devices_to_deliver_salient_information_in_super_markets>.

Pop, Cristian, "Introduction to the BodyCom Technology", AN1391, DS01391A, Microchip Technology, Inc., May 2, 2011.

Vu, et al., "Distinguishing Users with Capacitive Touch Communication", WINLAB, Rutgers University, In proceedings of: The 18th Annual International Conference on Mobile Computing and Networking ("MobiCom'12"), Aug. 22-26, 2012, Istanbul, Turkey.

Gibson, Randy W, "Non-final Office Action dated Dec. 20, 2019", U.S. Appl. No. 15/629,578, The United States Patent and Trademark Office, Dec. 20, 2019.

Gibson, Randy W, "Non-final Office Action dated Dec. 26, 2019", U.S. Appl. No. 15/629,365, The United States Patent and Trademark Office, Dec. 26, 2019.

\* cited by examiner

FIXTURE WITH BRACKETS, CROSSBAR MECHANISM, AND WEIGHING MODULE

BACKGROUND

Retailers, wholesalers, and other product distributors typically maintain an inventory of various items that may be ordered, purchased, leased, borrowed, rented, viewed, and so forth, by clients or customers. For example, an e-commerce website may maintain inventory in a fulfillment center. When a customer orders an item, the item is picked from inventory, routed to a packing station, packed, and shipped to the customer. Likewise, physical stores maintain inventory in customer accessible areas, such as in a shopping area, and customers can pick items from inventory and take them to a cashier for purchase, rental, and so forth.

Many physical stores also maintain inventory in a storage area, fulfillment center, or other facility that can be used to replenish inventory located in the shopping areas or to satisfy orders for items that are placed through other distribution pathways (e.g., e-commerce). Other examples of entities that maintain facilities holding inventory include libraries, museums, rental centers, and so forth. In each instance, for an item to be moved from one location to another, it is picked from its current location and transitioned to a new location. It is often desirable to monitor quantity of inventory at various places within the facility.

BRIEF DESCRIPTION OF FIGURES

The detailed description is set forth with reference to the accompanying figures. The use of the same reference numbers in different figures indicates similar or identical items or features. The figures are not necessarily drawn to scale, and in some figures, the proportions or other aspects may be exaggerated to facilitate comprehension of particular aspects.

Figure 1:
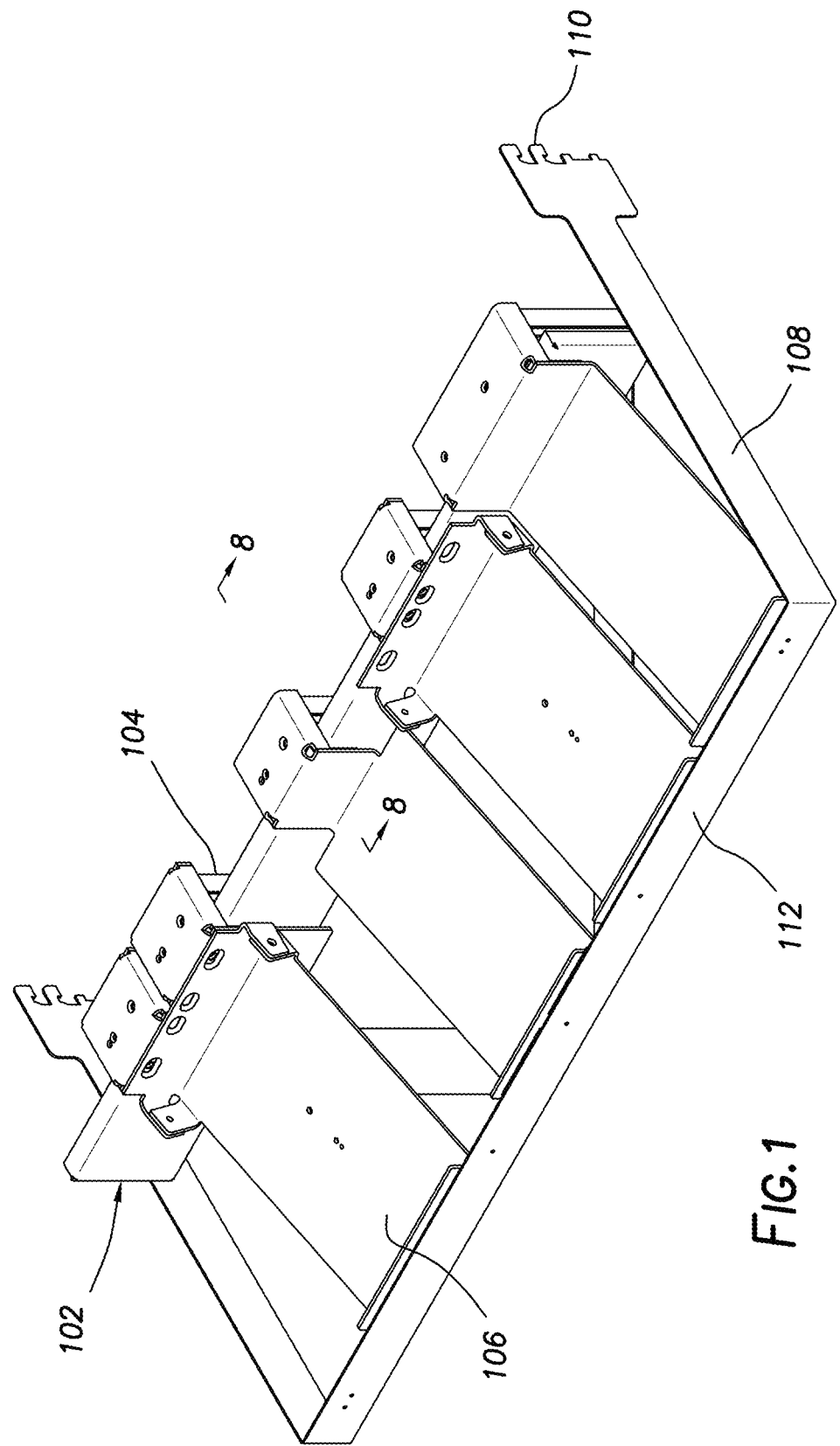
FIGS. 1-8 illustrate views of a fixture comprising weighing modules affixed to a crossbar, with the accessories to hold items cantilevered from the weighing modules, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

A materials handling facility (facility) or other setting may utilize fixtures that are used to stow or otherwise hold items. The fixtures, such as gondolas or racks, are equipped with weighing modules that generate weight data. The weighing modules may include one or more load cells and associated electronics. During operation, the weighing modules generate weight data from the load cells and send that weight data using a communication interface. The weighing modules may be arranged to gather information about the changes in weight occurring at a fixture.

A fixture may contain one or more of the weighing modules that support accessories holding the items. The weighing modules may include a mechanical interface that allows for mechanical coupling to other structures within the fixture, such as a crossbar, accessory, and so forth. The crossbar may couple to a supporting member, such as part of a gondola unit. The height of the crossbar may be adjusted to provide different vertical spacing. In some implementations, the mechanical interface may allow the weighing module to be added to the fixture, removed from the fixture, be re-positioned with respect to the crossbar, and so forth. This arrangement allows for easy reconfigurability to accommodate items of different physical sizes at different times by moving crossbars, weighing modules, and associated accessories.

The accessory provides physical support for one or more items. For example, the accessory may include a shelf, bin, hanger, and so forth. The accessory may be supported, at least in part, by one or more weighing modules. The weighing modules provide data indicative of the weight on the accessory.

The facility may include, or have access to, an inventory management system. The inventory management system may use data from the sensors at or near the fixture, such as the weight data from the weighing modules, to determine interactions in the facility. Interactions may comprise one or more of the user picking an item from a fixture, placing an item at a fixture, touching an item, bringing an object such as a hand or face close to an item, and so forth. For example, the inventory management system may generate interaction data that indicates what type and quantity of item a user picked from a particular fixture, and then use this interaction data to adjust the count of inventory stowed at the particular fixture.

Use of weighing modules and the weight data offers several operational benefits, especially in a materials handling facility or other facility. These benefits may include mechanical robustness, relatively low cost for installation and maintenance, reconfigurability, fast sensor response times, and so forth.

Described in this disclosure are various structures and systems that allow for a facility to be equipped with fixtures that utilize weighing modules having load cells. These structures may be modular, facilitating reconfiguration as the needs of the facility change.

By using the devices and techniques described herein, operation of the facility may be improved. Fixtures may be reconfigured to meet changing needs, faulty components may be easily replaced with functional ones, and so forth. As a result, flexibility of use is maximized while operating costs are reduced.

Illustrative System

The systems and devices described include weighing modules attached to one or more accessories. The weighing module provides load cell data that is indicative of a weight on the accessory. This load cell data may then be processed to determine if an item has been added to or removed from the accessory.

FIGS. 1-8 illustrate views of a fixture comprising weighing modules affixed to a crossbar, with the accessories to hold items cantilevered from the weighing modules, according to some implementations.

FIG. 1 illustrates a view of the fixture that comprises a crossbar 102 supporting six weighing modules 104. The weighing modules 104, in turn, support a total of four accessories 106.

The weighing modules 104 include one or more load cells and generate weight data. The accessory 106 provides physical support for an item. For example, the accessory 106 may comprise a tray such as depicted here, a bin, a hanger, and so forth. As depicted here, in some implementations an accessory 106 may be supported by a single weighing module 104, or by two or more. For example, an accessory 106 that is used to stow items having a weight that exceeds a maximum weight capacity of the load cell of a single weighing module 104 may be supported by two weighing modules 104.

The weight data from the weighing modules 104 may be provided to an inventory management system. The inventory management system may use the weight data to determine changes to inventory, for example counts of inventory stored at a particular accessory 106.

Brackets 108 are mounted to or otherwise mechanically support the crossbar 102. For example, a left bracket 108 and a right bracket 108 are arranged on a left end and right end of the crossbar 102, respectively. The brackets 108 include engagement features 110, such as hooks or tabs, that are configured to mechanically engage corresponding engagement features such as slots on a vertical support. For example, the engagement features 110 may be configured to attach to slots in a freestanding fixture used to display items, such as a gondola.

A front bracket 112 extends from the left bracket 108 to a right bracket 108 along a front of the device. For example, the front bracket 112 is arranged in front of a leading or frontal edge of the accessory 106. A gap is present between the accessory 106, the bracket 108, and front bracket 112 allowing the accessory 106 to move under the influence of a change in weight of a load on the accessory 106. In some implementations, the bracket 108 and the front bracket 112 may comprise a single piece of material. For example, a piece of sheet metal may be cut and bent to form the bracket 108, the engagement features 110, and the front bracket 112.

As mentioned above, in some situations two or more weighing modules 104 may be used to support an accessory 106. A first location of the accessory 106 may be affixed to a first weighing module 104 such that lateral motion is minimized. A second location of the same accessory 106 may be affixed to a second weighing module 104 in such a fashion that vertical support is provided while lateral movement may take place. For example, the second location of the accessory 106 may rest atop a bracket, lip, or other surface of the second weighing module 104 that is affixed to the load cell therein. This lateral movement may prevent the accessory 106 from binding.

Figure 2:
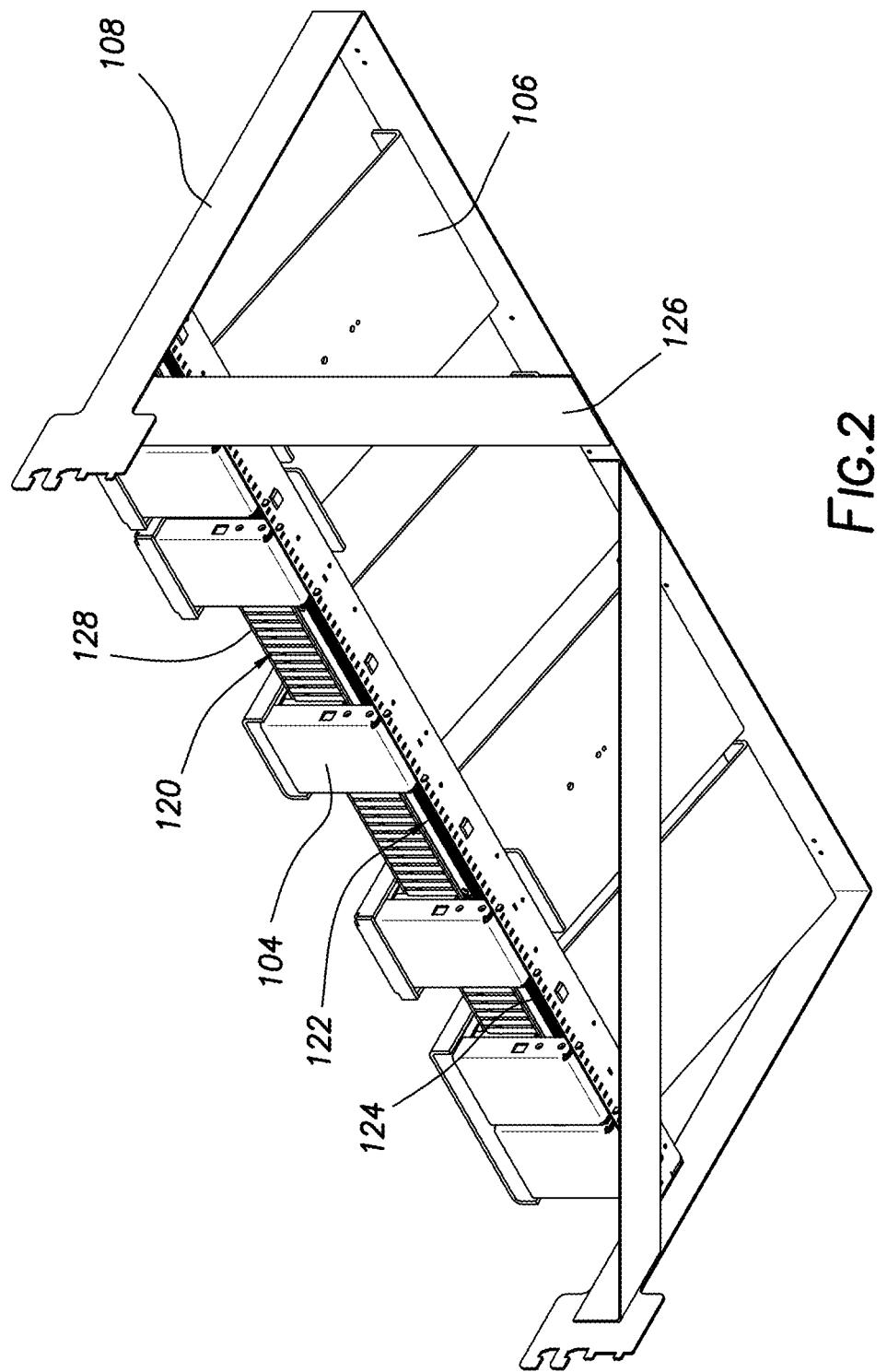

FIG. 2 illustrates another view of the fixture of FIG. 1 depicting an underside. In this view, a back side of the crossbar 102 is visible showing a crossbar backpiece 128. The crossbar backpiece 128 includes crossbar engagement slots 120 and a plurality of electrical conductors on a circuit board 122. In some implementations these conductors may be arranged as linear electrical contacts, with each linear electrical contact having a long axis that is parallel to a long axis of the crossbar 102. In other implementations, instead of or in addition to the crossbar engagement slots 120, the crossbar backpiece 128 may include one or more of tabs, ridges, and so forth.

In another implementation, the linear conductors may be arranged on an interior surface or back of the circuit board 122 while vias or pass-throughs provide electrical connections to pads on the exterior surface. Contacts, pins, or other conductive elements on the weighing module 104 may then come into contact with these pads, establishing electrical contact. In one implementation, the exterior surface may include a conductor, such as a copper ground plane. Within the ground plane, the pads are present, separated from the copper ground plane by a gap or electrical insulator. This configuration may reduce electromagnetic interference emitted or received by operation of the circuit board 122.

The crossbar engagement slots 120 provide a structure for a corresponding portion of the weighing module 104 to mechanically engage. The crossbar engagement slots 120 may be rectangular in cross section, with the cross section taken perpendicular to a long axis of the engagement slot 120. In some implementations, a top portion of the engagement slot 120 may be wider than a lower portion. This top portion narrows to the rectangular cross section farther down the engagement slot 120. This wide top portion followed by the narrowing may facilitate installation of a weighing module 104. For example, a slight misalignment would be corrected as the wider portion captures the engagement feature of the weighing module 104 and guides that engagement feature into the crossbar engagement slot 120. The engagement slow 120 may include one or more constrictions, in which the width of the slot narrows. These constrictions may help limit movement of the weighing module 104 once engaged.

In other implementations the crossbar engagement slots 120 may utilize different cross sectional shapes. For example, the crossbar engagement slot 120 may be trapezoidal in cross section.

One or more electrical contacts may be provided along the width of the crossbar 102. The electrical contacts provide electrically conductive pathways that may be used to provide electrical power, data communication pathways to transfer data, and so forth between the crossbar 102 and the weighing module 104. As illustrated here, a circuit board 122 having a plurality of traces is mounted to the crossbar backpiece 128. Along this circuit board 122 are linear traces of electrically conductive material such as aluminum or copper. These traces have a long axis that is parallel to the long axis of the crossbar 102. The conductors on the circuit board 122 in turn are connected to other electronics within the fixture, to connectors, and so forth. For example, the crossbar 102 may include an RJ45 jack that is wired to the conductors on the circuit board 122, facilitating the connection of the conductors on the circuit board 122 to a power supply, data network, and so forth.

Also shown is a lower engagement section 124. The lower engagement section 124 may include one or more mechanical engagement features, such as tabs, slots, recesses, rails, and so forth that are configured to mate with a corresponding engagement feature of a weighing module 104. For example, a tab may extend vertically from a bottom of a weighing module 104 to engage a hole or slot in the lower engagement section 124. In another example, the bottom of the weighing module 104 may include a hole or slot into which a tab extending from the lower engagement section 124 may be inserted.

Also depicted are a pair of cross braces 126 that extend from approximately the center of the front bracket 112 to a rear portion of the brackets 108. The cross braces 126 may improve rigidity of the fixture.

Figure 3:
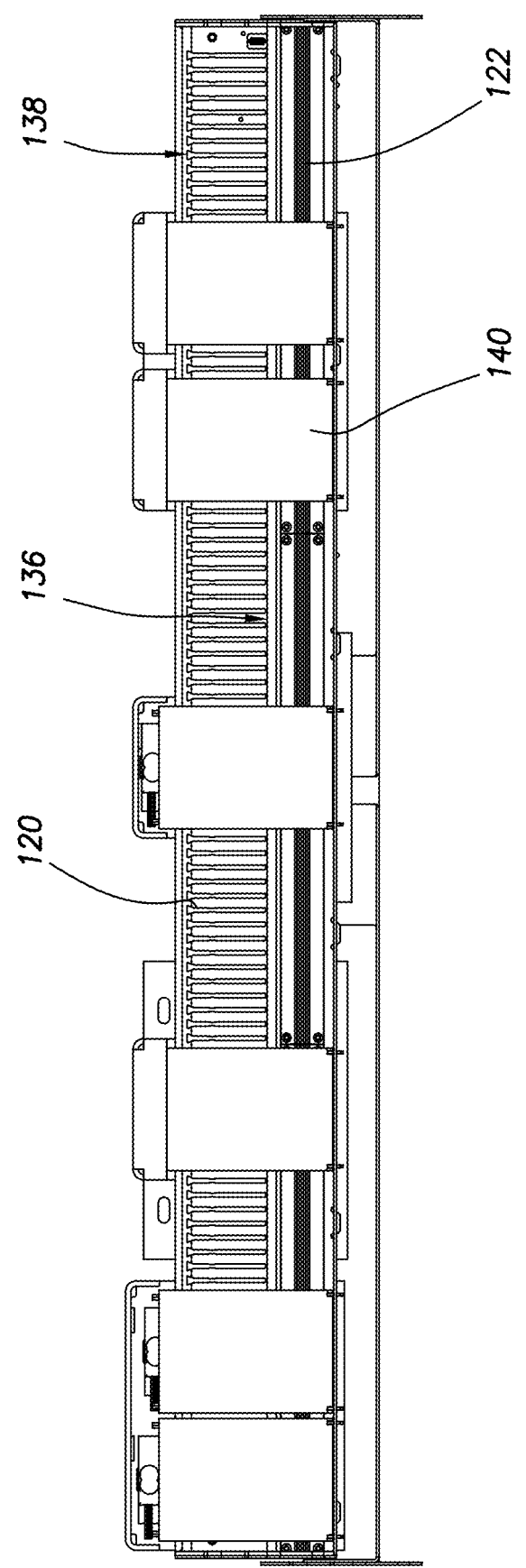

FIG. 3 depicts a view the fixture of FIG. 1 showing the back of the crossbar 102. In this view, the crossbar engagement slots 120 are visible. The crossbar engagement slots 120 may incorporate an engagement slot stop 136, such as a block or termination of the slot that otherwise limits vertical motion within the crossbar engagement slot 120. For example, the crossbar engagement slots 120 and the engagement slot stop 136 may be milled or formed into the crossbar backpiece 128.

In this view, the widened top portion 138 of the engagement slot 120 is visible. The widened top portion 138 may facilitate installation of the weighing module 104. The engagement slot 120 may include a construction or narrowing for at least a portion of the engagment slot 120. For example, a lower two-thirds of the engagement slot 120 may be narrower than an upper one-third of the engagement slot 120.

Also shown are the exterior backpieces 140 of the respective weighing modules 104. The circuit board 122 comprising a plurality of electrical conductors is also visible. When the weighing module 104 is installed on the crossbar 102, respective electrical contacts on an interior surface of the weighing module 104 come into contact with respective electrical contacts on the circuit board 122. These electrical contacts allow for the transfer of electrical power and data between the crossbar 102 and the weighing module 104. For example, the circuit board 122 may comprise four horizontal traces extending left to right. Two traces may be used to provide electrical power while two traces are used to provide data communication.

Figure 4:
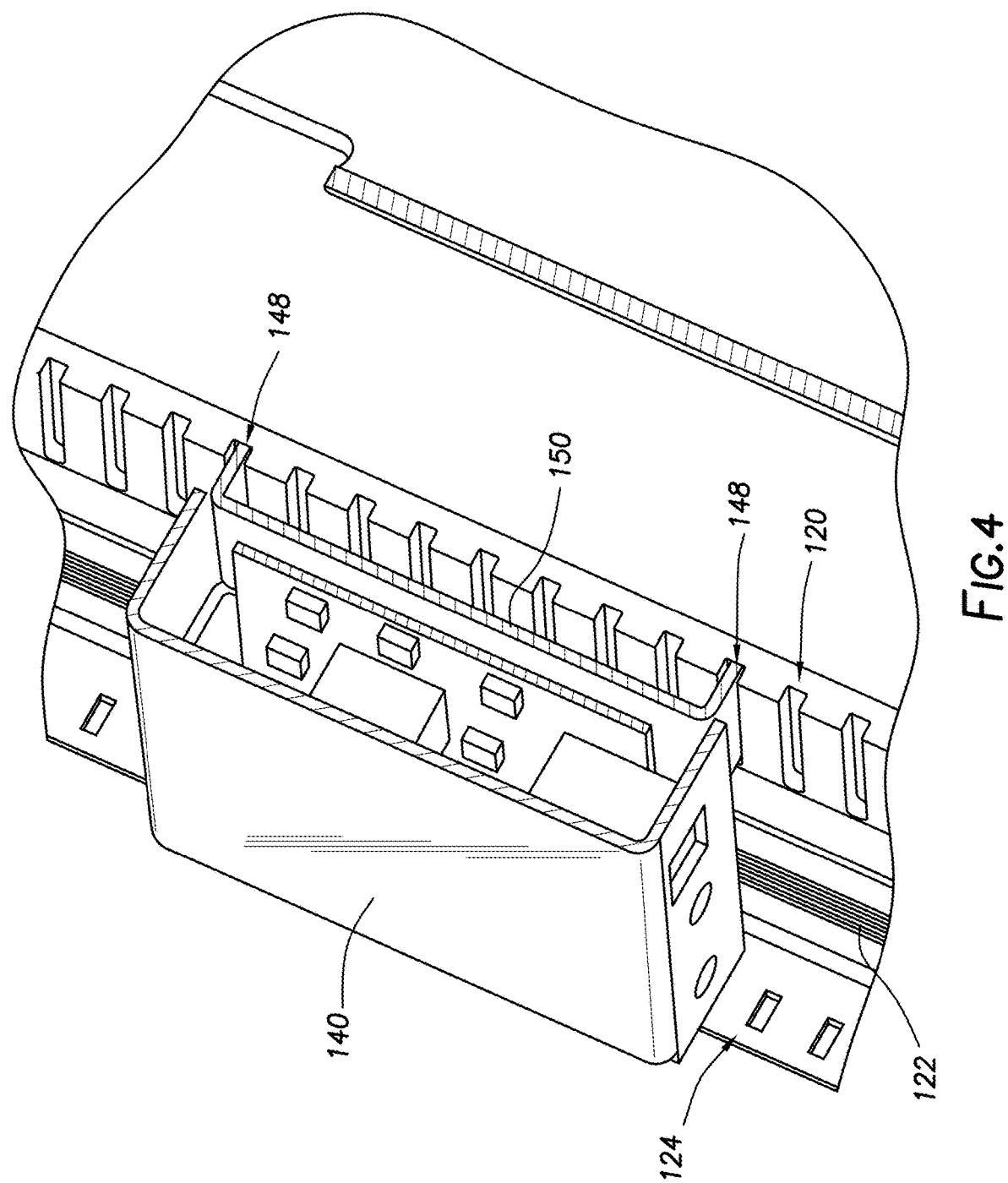

FIG. 4 depicts a cross sectional view of the crossbar 102 and the weighing module 104 of FIG. 1. In this view, the exterior backpiece 140 is visible. A circuit board 122 with electronics is enclosed within the exterior backpiece 140. The weighing module 104 includes one or more engagement rails 148. The engagement rails 148 extend away from a rear wall 150 of the weighing module 104. In some implementations the engagement rail 148 comprises a lip that is formed at a right angle with respect to a planar surface of the rear wall 150. When installed, the engagement rails 148 are inserted at least partially within the crossbar engagement slots 120. Once engaged, left to right or lateral movement of the weighing module 104 is constrained. For example, the crossbar engagement slots 120 have a long axis that is oriented vertically. When engaged, the engagement rails 148 prevent the weighing module 104 from moving perpendicularly (such as left and right) with respect to the crossbar 102.

In some implementations the engagement rail 148 may be sloped or slanted at a lower end. For example, the engagement rail 148 may comprise a first end that is distal to the top of the weighing module 104. The first end may slope from a first distance with respect to the rear wall 150 to a second distance that is less than the first distance.

In other implementations, the engagement rail 148 may be omitted. Instead, a screw, wedge, clamp, or other mechanism may be used to prevent lateral motion of the weighing module 104. For example, a set screw may be turned that places pressure on the front or back of the crossbar 102.

Also depicted is the circuit board 122 with the electrically conductive traces. The lower engagement section 124 is also shown with holes therein. One or more tabs or pegs may extend from a bottom of the weighing module 104 to engage one or more of the holes.

Figure 5:
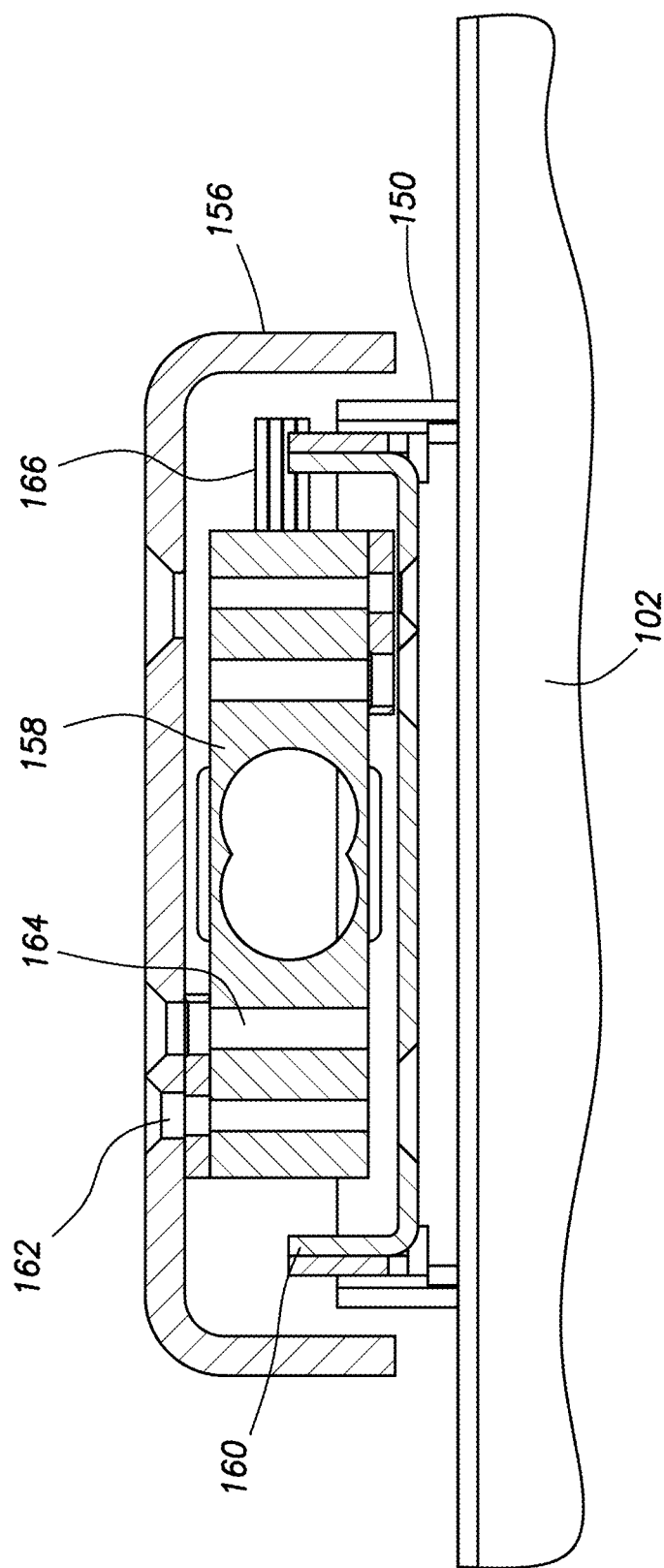

FIG. 5 depicts a cross sectional view of the crossbar 102 and the weighing module 104 of FIG. 1. A module frontpiece 156 forms a cap or top of the weighing module 104, and extends down. Beneath the module frontpiece 156 is a load cell 158. In some implementations the load cell 158 may comprise a single point load cell. The load cell 158 may have a first end and a second end. Each end may be affixed using one or more fasteners to another member. In some implementations, the fasteners may be removeable, such as bolts, screws, cams, and so forth. This removability facilitates repair by allowing a damaged or defective load cell 158 to be removed and replaced. For example, as shown here the module frontpiece 156 may include a pair of holes 162 that are unthreaded. These holes 162 may be countersunk to allow screws to be inserted and made flush against the outer surface of the module frontpiece 156. The first end of the load cell 158 may include a pair of threaded holes 164 which the screws mechanically engage. Thus, a screw may be used to join the module frontpiece 156 to the first end of the load cell 158. In a similar fashion, an upper wall 160 of weighing module 104 may include holes 162 through which screws may be inserted to engage threaded holes 164 in the second end of the load cell 158. Also shown is the rear wall 150. In some implementations, the rear wall 150 and the upper wall 160 may comprise a single piece of material.

The load cell 158 may incorporate a spacer or step that allows a gap between adjacent structures such as the module frontpiece 156 and the upper wall 160 during operation. When a load is applied to the load cell, this gap may change as the load cell 158 undergoes a deflection.

Load cell wiring 166 conveys electrical signals from the load cell 158 to electronics for use in generating load cell data. For example, the load cell wiring 166 may connect to electronics within the exterior backpiece 140 of the weighing module 104.

Figure 6:
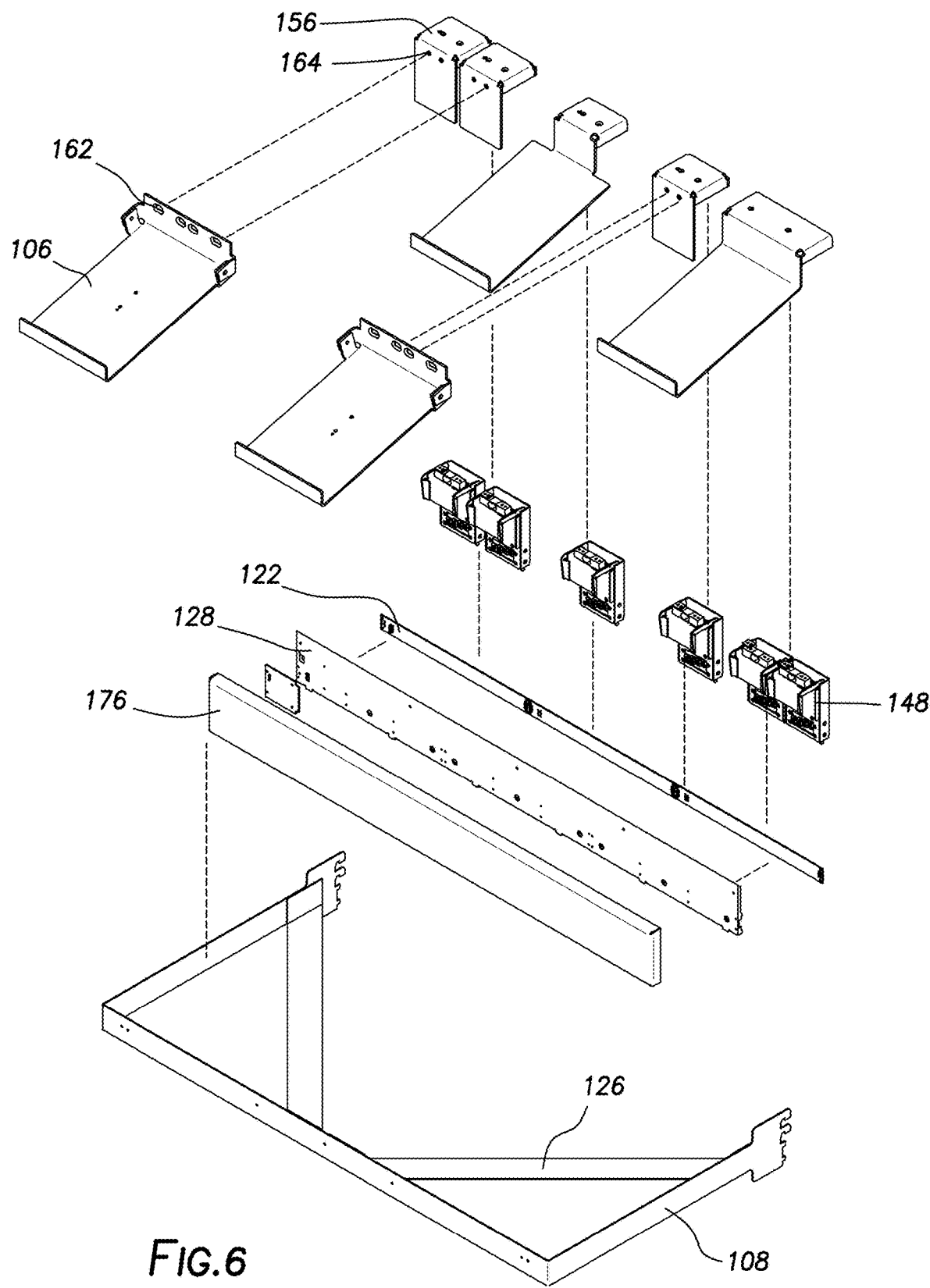

FIG. 6 depicts an exploded view of the fixture of FIG. 1. In this view, the accessories 106 are mounted to a front of one or more respective module frontpieces 156 of weighing modules 104. For example, the accessories 106 may include one or more unthreaded holes 162 while the module frontpiece 156 includes one or more corresponding threaded holes 164. A screw may then be inserted through the hole 162 on the accessory 106 into the threaded hole 164 on the module frontpiece 156.

In the exposed portion of the weighing module 104 the engagement rails 148 are visible. The circuit board 122 is depicted that is attached to a lower portion of the back of the crossbar backpiece 128. The crossbar backpiece 128 is attached to a back of a crossbar frontpiece 176. The crossbar 102 may be affixed to a midpoint between a front and back of the brackets 108.

Figure 7:
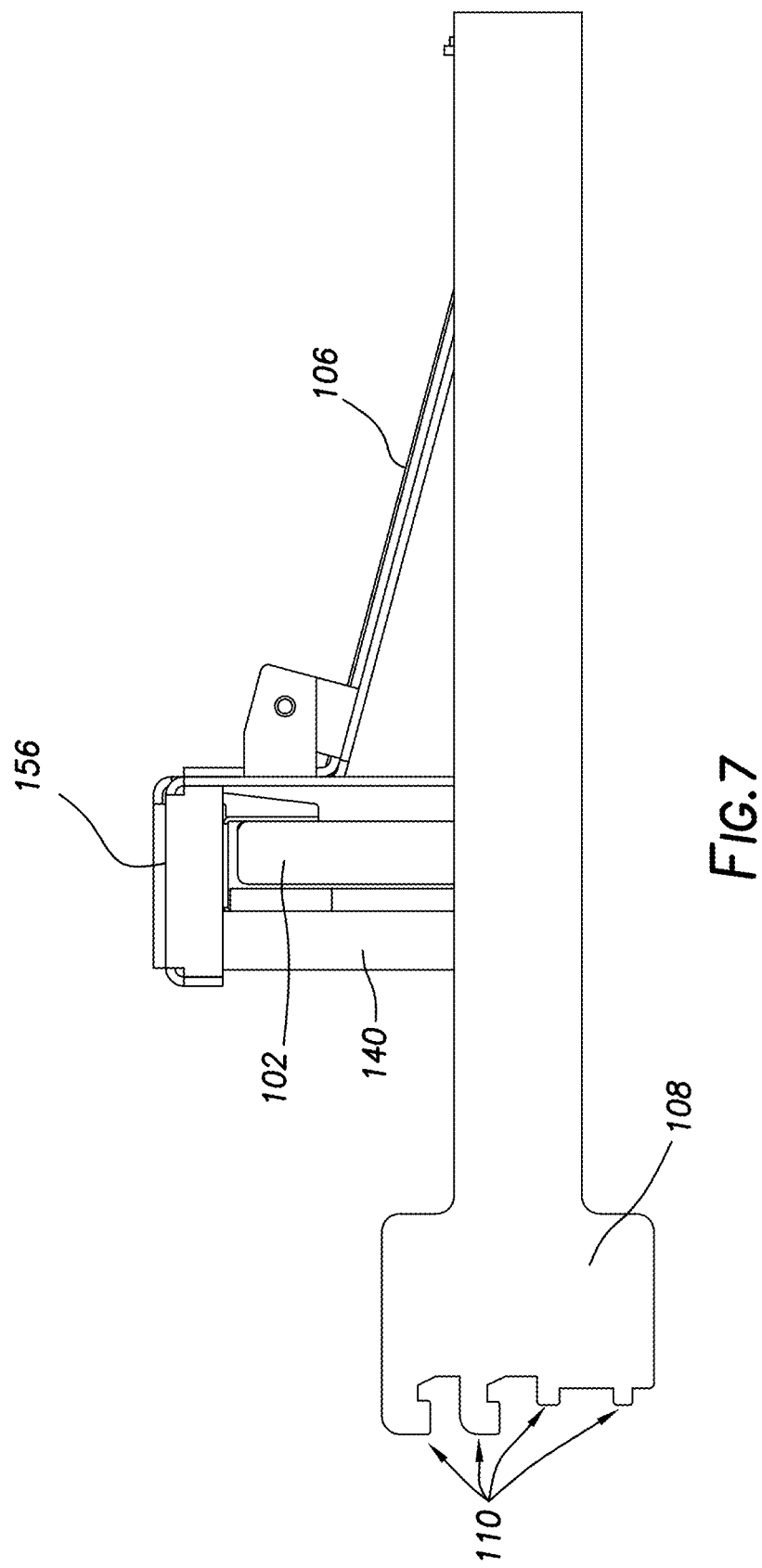

FIG. 7 depicts a side view of the fixture of FIG. 1. A bracket 108 with the engagement features 110 is shown. The crossbar 102 is depicted, with the weighing module 104 mounted atop and around the crossbar 102. To the rear of the crossbar 102 is the exterior backpiece 140 of the weighing module 104, while the module frontpiece 156 provides a cap that extends across a top of the weighing module 104 and down a front of the crossbar 102. Attached to the module frontpiece 156 is the accessory 106.

Figure 8:
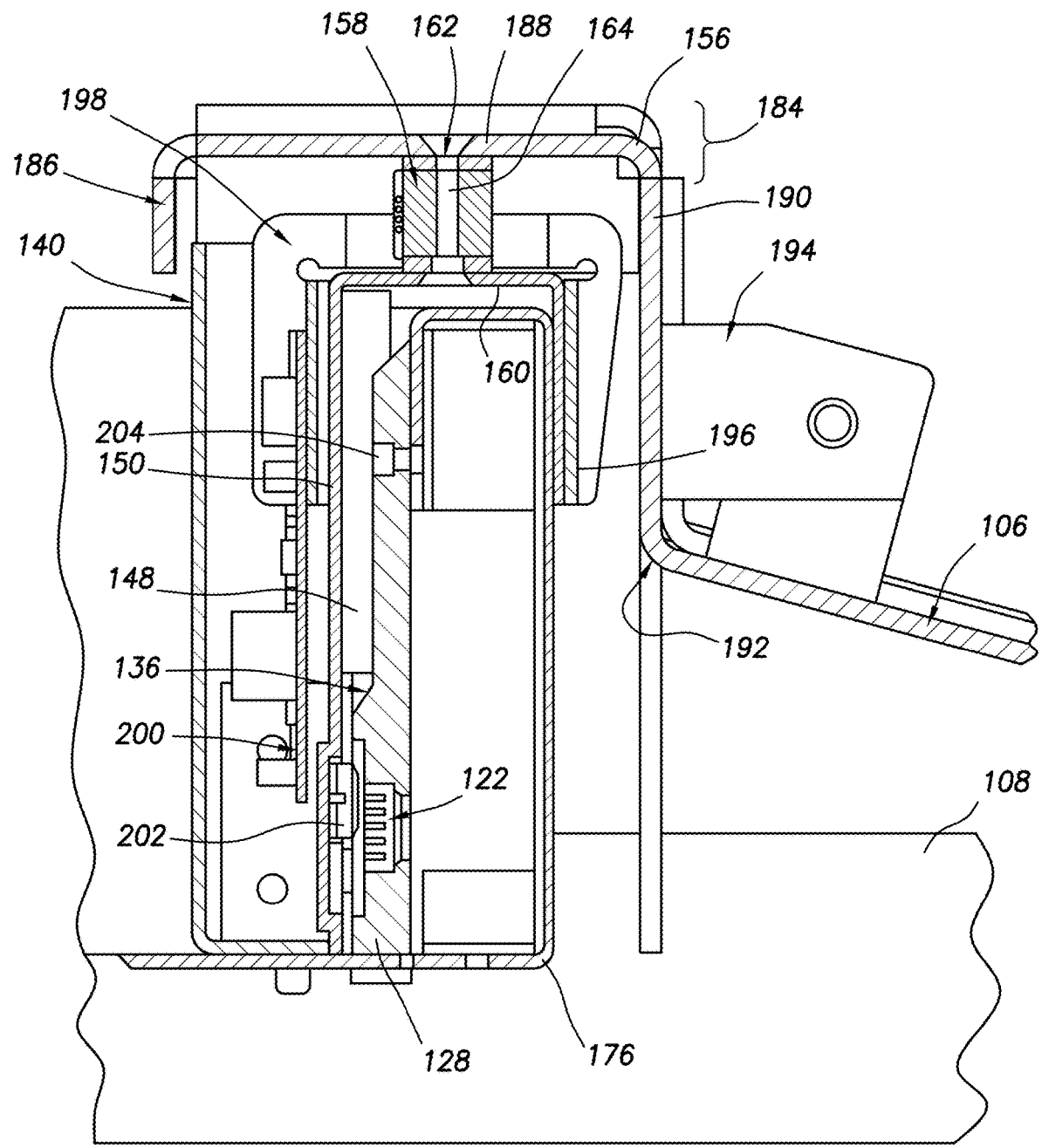

FIG. 8 depicts a cutaway side view of the fixture of FIG. 1 at a weighing module 104. Shown is a cap 184 that may be formed from the module frontpiece 156. The cap 184 includes a rearward rear cap wall 186 that is behind the load cell 158 and has a bottom edge that is below a top edge of the exterior backpiece 140. The cap 184 also comprises a top cap wall 188 that extends from the rear cap wall 186 to a front cap wall 190. The front cap wall 190 extends down from the top cap wall 188 in front of at least a portion of the crossbar 102. In cross section, the cap 184 may exhibit a "C" or "U" shape.

In the implementation depicted here, the module frontpiece 156 is shaped to form the accessory 106, with the module frontpiece 156 and the accessory 106 formed from a single piece of material. For example, a bend 192 may be formed in the module frontpiece 156 causing the material to extend at an angle away from the rear wall 150 of the weighing module 104. An accessory side brace 194 may be provided that adds structural strength to the interface between the accessory 106 and the front cap wall 190. The rear wall 150 of the weighing module 104 may be longer or taller than the interior front wall 196 or the front cap wall 190.

The module frontpiece 156 is attached to a first end of the load cell 158. For example, one or more removeable fasteners such as screws or bolts may be used to join the module frontpiece 156 to the first end of the load cell 158.

The second end of the load cell 158 is in turn mounted to an interior member of the weighing module 104, such as the upper wall 160. For example, one or more removeable fasteners such as screws or bolts may be used to join the second end of the load cell 158 to the upper wall 160.

The interior member of the weighing module 104 may comprise the upper wall 160, the rear wall 150, and an interior front wall 196. Together, this interior member forms a concave region or recess which fits over at least a portion of the crossbar 102. In some implementations, the interior member may comprise a single piece. For example, the structure of the crossbar 102 comprising the crossbar frontpiece 176, the crossbar backpiece 128, and the circuit board 122, may be at least partially covered by the interior members of the weighing module 104. The crossbar backpiece 128 may be joined to the crossbar frontpiece 176 using one or more backpiece fasteners 204. For example, a screw, bolt, or rivet may be used to join the crossbar backpiece 128 to the crossbar frontpiece 176.

Shown within the enclosure provided by the exterior backpiece 140 of the weighing module 104 is the weighing module circuit board 200. The load cell wiring 166 (not shown here) may connect to the weighing module circuit board 200. For example, the weighing module circuit board 200 may be used to support circuitry that generates load cell data from the load cell 158. Continuing the example, the weighing module circuit board 200 may include an analog-to-digital converter, digital signal processor, and so forth. The weighing module circuit board 200 may include a communication interface to send the load cell data via the traces on the circuit board 122 to another device.

A weighing module connector 202 provides electrical contacts that are configured to couple to corresponding electrical conductors on the circuit board 122. For example, the weighing module connector 202 may comprise one or more spring contacts, pogo pins, contact pads, and so forth. When the weighing module 104 is installed, the electrical contacts in the weighing module connector 202 provide electrical contact with corresponding electrical conductors of the circuit board 122 on the crossbar 102. The weighing module connector 202 may be connected to one or more devices within the weighing module 104, such as circuitry on the weighing module circuit board 200. Power and data communication may be supplied by the crossbar 102 through the electrical contacts of the circuit board 122 as accessed by the weighing module connector 202.

Also shown is the weighing module 104 engagement rail 148 and the engagement slot stop 136. To provide additional strength and structural stiffness, an upper bracket 198 may be incorporated into the weighing module 104. The upper bracket 198 may extend along at least an upper portion of the rear wall 150, the upper wall 160, and an upper portion of the front cap wall 190. For example, the upper bracket 198 may be approximately "U" shaped in cross section. In the implementation depicted here, the weighing module 104 may include two upper brackets 198, one arranged at the left and right sides of the weighing module 104, with the load cell 158 arranged in between.

The crossbar 102 may be mounted to the bracket 108. For example, the crossbar 102 may be screwed or bolted to the left and right brackets 108.

Figure 9:
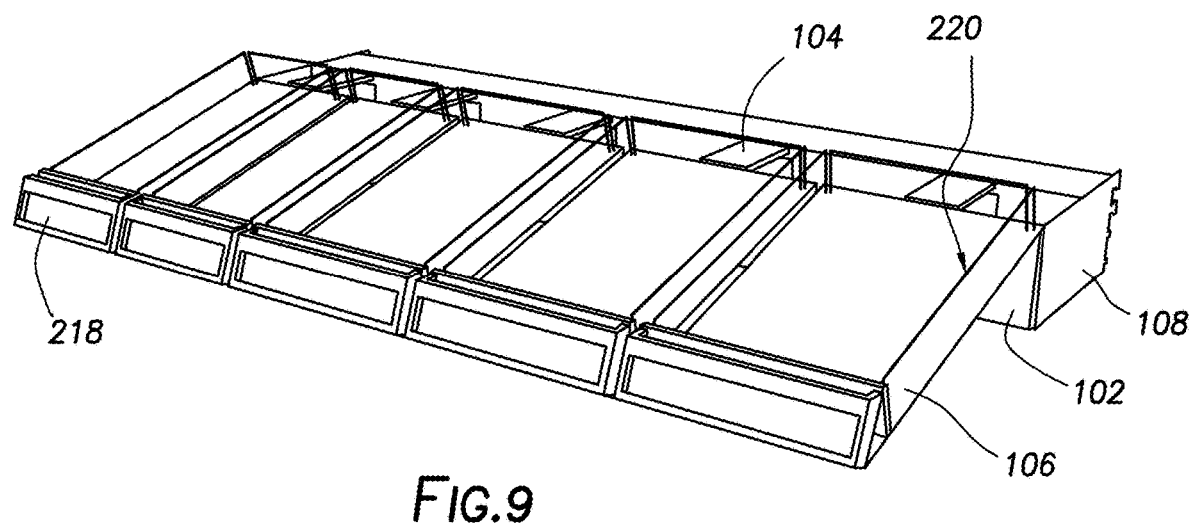
FIG. 9 illustrates a view of a fixture in which a weighing module is mounted in front of the crossbar, according to some implementations.

FIG. 9 depicts another implementation of a fixture in which the modules are mounted to a front of the crossbar 102. As depicted here the weighing modules 104 may mount to a front of the crossbar 102. For example, the weighing modules 104 may be screwed to a front of the crossbar 102. The accessories 106 may cantilever out, supported at a near end by the weighing modules 104 and at the far end extended towards the front of the fixture.

A ticket channel 218 may be provided. Printed tags may be inserted into the ticket channel 218. For example, the tags may include information such as a name of an item, item identifier, price, and so forth, for the type of item stowed by the particular accessory 106. The ticket channel 218 may be affixed to the front of the accessory 106.

Wire guides 220 may be arranged around at least a portion of a perimeter of the accessory 106. The wire guides 220 may help contain items within the accessory.

Figure 10:
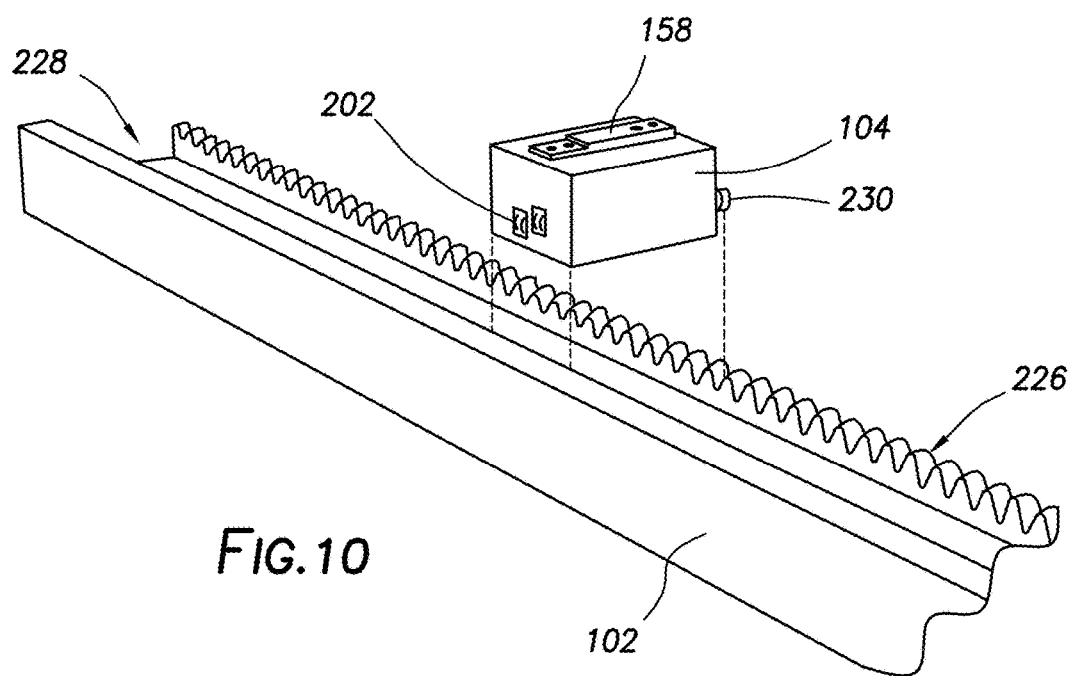
FIG. 10 illustrates a view of a fixture in which a weighing module is inserted into the crossbar vertically, according to some implementations.

FIG. 10 depicts a view of a fixture in which a weighing module 104 is inserted into a channel of the crossbar 102. The weighing module 104 is modular and repositionable along the crossbar 102. In this implementation, the crossbar 102 comprises a crossbar channel 228. The weighing module 104 may be emplaced at least partially within the crossbar channel 228. One or more crossbar engagement features 226 on the crossbar 102 may be configured to engage a module engagement feature 230 on the weighing module 104. For example, the crossbar engagement features 226 may comprise teeth or ridges into which the corresponding module engagement feature 230 such as a pin or post may fit. In other implementations, the crossbar engagement features 226 may comprise tabs, slots, recesses, protrusions, and so forth. These crossbar engagement features 226 are located along an upper surface or edge of at least a portion of the crossbar 102. The engagement of the module engagement feature 230 with the crossbar engagement feature 226 may prevent the weighing module 104 from moving laterally when installed. The front of the crossbar 102 comprises a planar surface.

Within the crossbar channel 228 may be the circuit board 122 (not shown) or other arrangement of electrical conductors. The weighing module 104 may include weighing module connectors 202 on a complementary face, configured to engage the conductors on the circuit board 122 when installed in the crossbar channel 228.

A load cell 158 is mounted proximate to a top of the weighing module 104. An accessory 106 may be affixed to a first end of the load cell 158, while a second end of the load cell 158 is mounted to a member of the weighing module 104.

Figure 11:
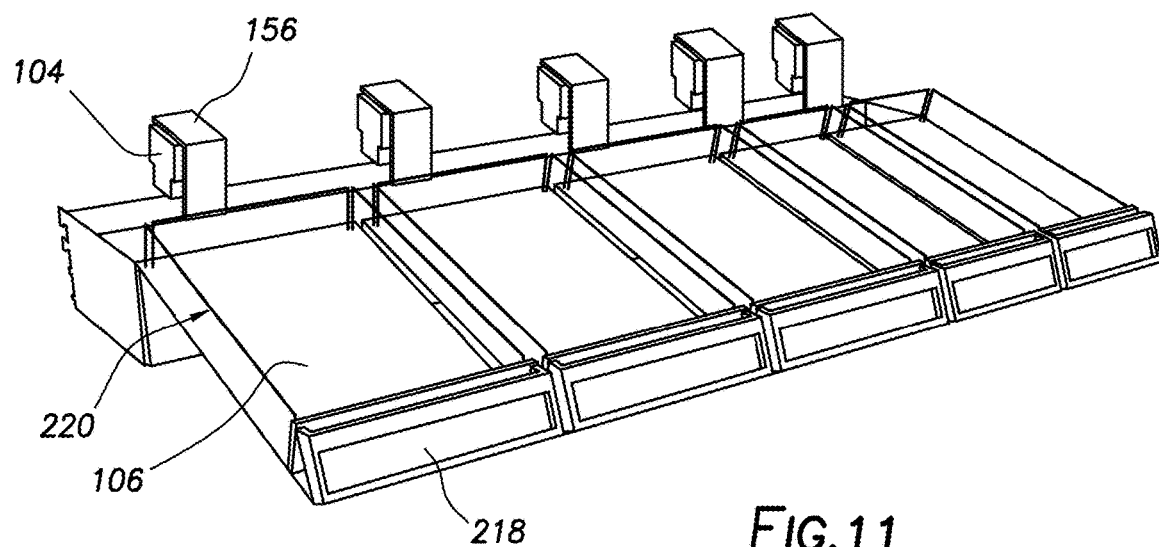
FIG. 11 illustrates a view of a fixture in which a weighing module is mounted atop the crossbar, according to some implementations.

FIG. 11 illustrates a view of a fixture in which a weighing module 104 is mounted atop the crossbar 102, according to some implementations. In this implementation the module frontpiece 156 of the weighing module 104 extends down and then attaches to an accessory 106 such as a tray that cantilevers away from the crossbar 102. The accessory 106 may include a ticket channel 218, wire guides 220, and so forth.

Figure 12:
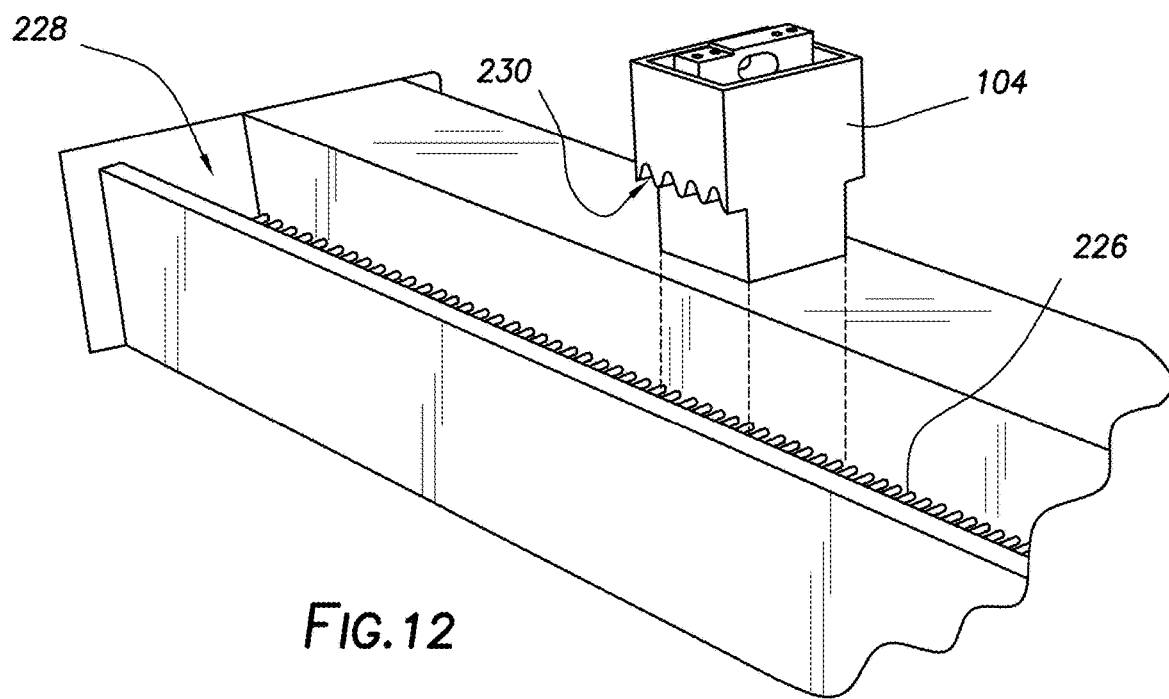
FIG. 12 illustrates a view of a fixture in which a weighing module is inserted into a channel of the crossbar, according to some implementations.

FIG. 12 illustrates a view of a fixture in which a weighing module 104 is inserted into crossbar channel 228 of the crossbar 102, according to some implementations. In this illustration, the crossbar engagement features 226 are located within the crossbar channel 228. The weighing module 104 includes one or more module engagement features 230 along an underside of an overhang. When the weighing module 104 is inserted into the crossbar channel 228, the module engagement features 230 sit atop the corresponding crossbar engagement features 226. Not shown are the circuit board 122 and the weighing module connector 202 which provide electrically conductive pathways between the crossbar 102 and the weighing module 104.

Figure 13:
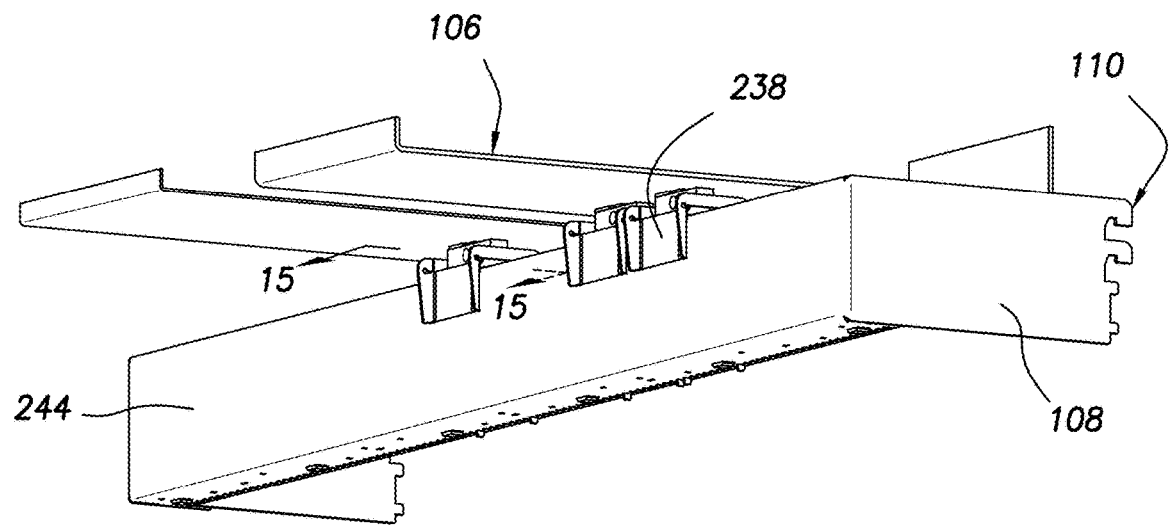
FIGS. 13-15 illustrate views of a fixture comprising a modular weighing module affixed to a crossbar, and the accessories are mounted atop the weighing modules, according to some implementations.
Figure 14:
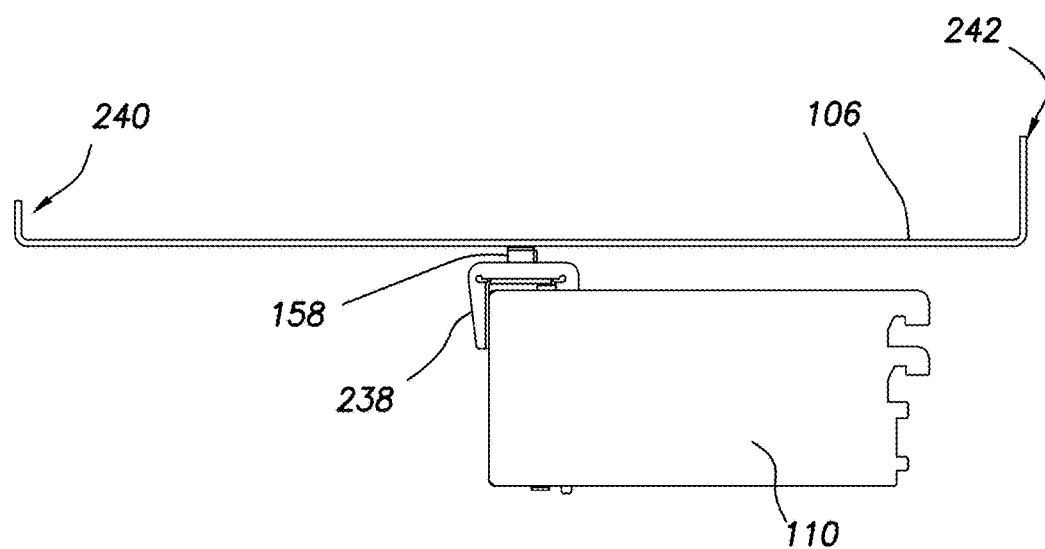
Figure 15:
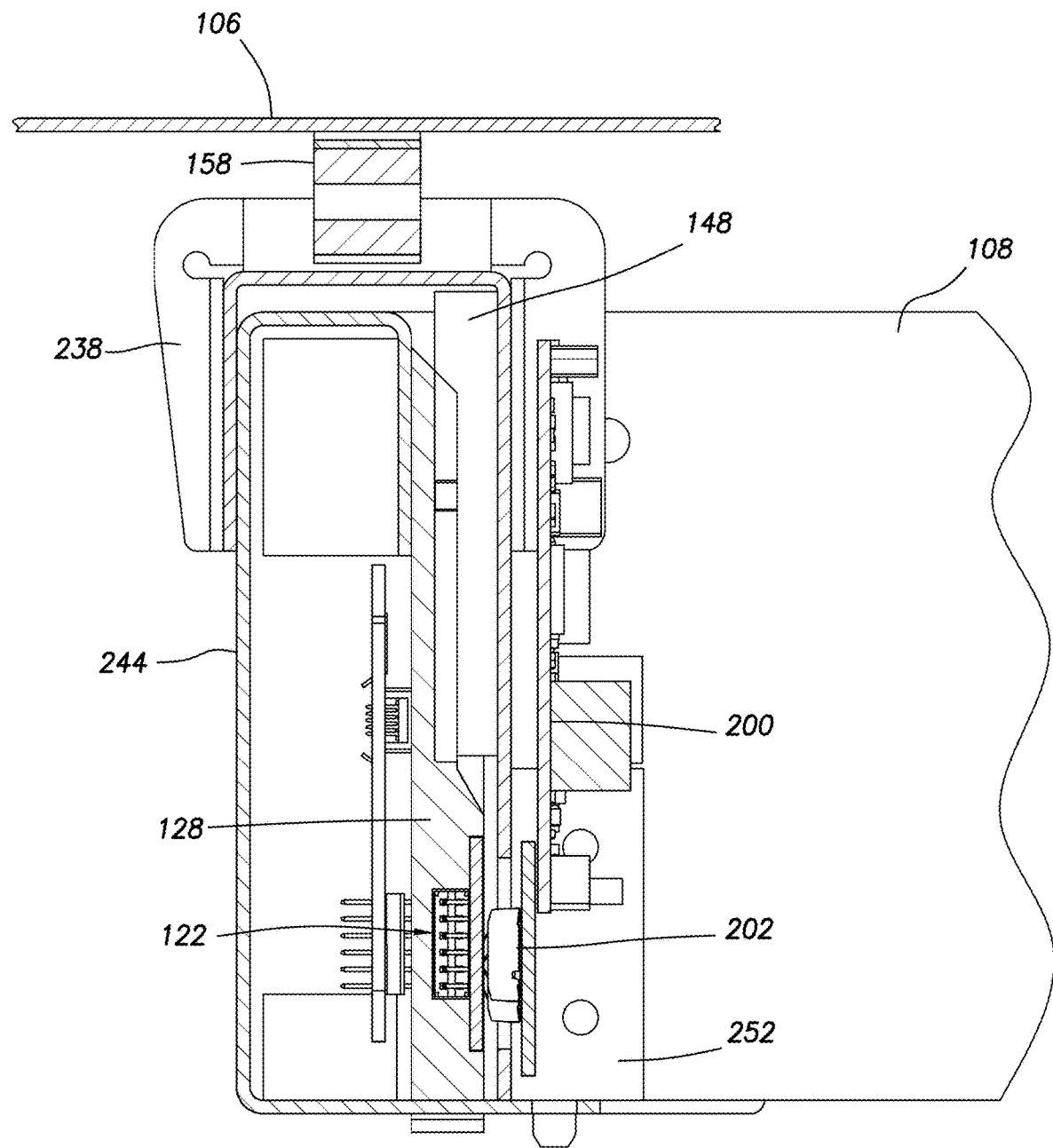

FIGS. 13-15 illustrate views of a fixture comprising a modular weighing module affixed to a crossbar, and the accessories are mounted atop the weighing modules, according to some implementations.

FIG. 13 depicts a view of an underside of the fixture in which the accessory 106 is supported by one or more weighing modules 104 arranged underneath. In this illustration crossbar 102 is shown with a crossbar front cover 244 and brackets 108 on the left end of the crossbar 102 and the right end of the crossbar 102. As described above, the brackets 108 may include one or more engagement features 110. The weighing module 104 includes an upper bracket 238 that engages at least a portion of the crossbar 102.

FIG. 14 depicts a side view of the fixture of FIG. 13. The accessory 106 may comprise a tray having a front lip 240 and a rear lip 242. The front lip 240 may be shorter than the rear lip 242. The accessory 106 mounts to the load cell 158 at a point between the front and rear of the tray accessory 106. For example, a first end of the load cell 158 is attached to the accessory 106 while the second end of the load cell 158 is attached to the upper bracket 238. The accessory 106 extends horizontally beyond the edges of the weighing module 104.

FIG. 15 depicts a cross section of the weighing module 104 while mounted on the crossbar 102. The accessory 106 is mounted to a first end of the load cell 158 while a second end of the load cell 158 is mounted to portion of the weighing module 104. For example, the second end of the load cell 158 may attach to the upper bracket 238, an interior wall, and so forth.

The upper bracket 238 extends from a top of the crossbar front cover 244 down along at least a portion of the crossbar front cover 244. The crossbar 102 may include a crossbar backpiece 128 that includes crossbar engagement slots 120. One or more engagement rails 148 of the weighing module 104 may engage the crossbar engagement slots 120.

The crossbar backpiece 128 may include a circuit board 122 or other electrical contacts to which a weighing module connector 202 may come into content when the weighing module 104 is installed on the crossbar 102.

A rear coverplate mount 252 may extend from the interior wall of the weighing module 104. A rear coverplate (not shown) may be attached to the rear coverplate mount 252. The rear coverplate may provide protection to the weighing module circuit board 200 or other components within the weighing module 104.

The load cell 158 may be joined to the various elements as described above. For example, the accessory 106 may include unthreaded holes 162 through which a screw is inserted and used to engage a corresponding threaded hole 164 in the load cell 158.

FIGS. 16-20 illustrate views of a fixture that includes a crossbar with integrated weighing modules, according to some implementations. In this implementation, the integrated weighing modules are affixed to particular positions within the fixture.

Figure 16:
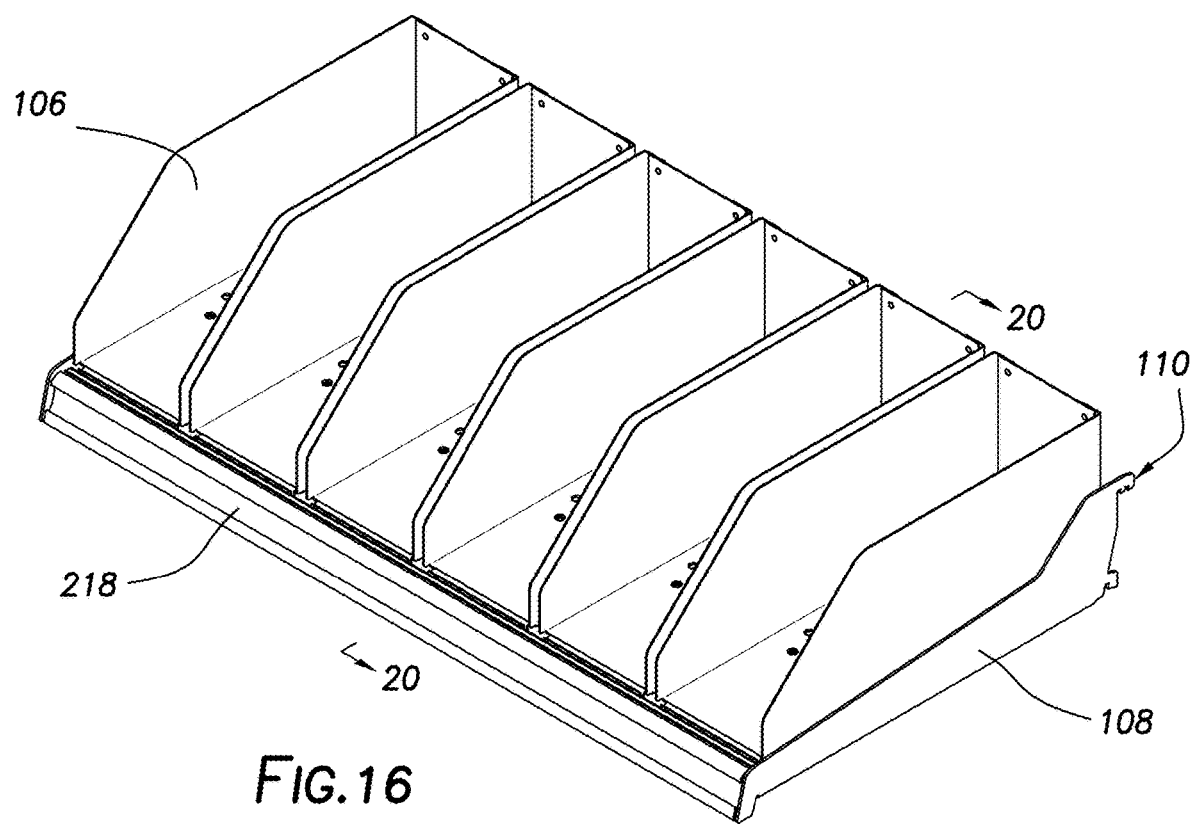
FIGS. 16-20 illustrate views of a fixture that includes a crossbar with integrated weighing modules, according to some implementations.

FIG. 16 depicts a front view of the fixture with six accessories 106 comprising bins that are arranged left to right. While six accessories 106 are shown, it is understood that the fixture may include more or fewer accessories 106. The size, such as the width of the respective accessories 106 may also differ within the fixture. For example, the leftmost accessory 106 may be a bin that is 2 inches wide while an adjacent accessory 106 is 6 inches wide.

In front of the accessories 106 a ticket channel 218 extends from a left bracket 108 on a left end to a right bracket 108 on a right end of the fixture. The brackets 108 may support the ticket channel 218. A gap or other clearance between the accessories 106 and the brackets 108 and the ticket channel 218 allow the individual accessories 106 to move or deflect responsive to changes in weight of the loads placed within the bins.

Figure 17:
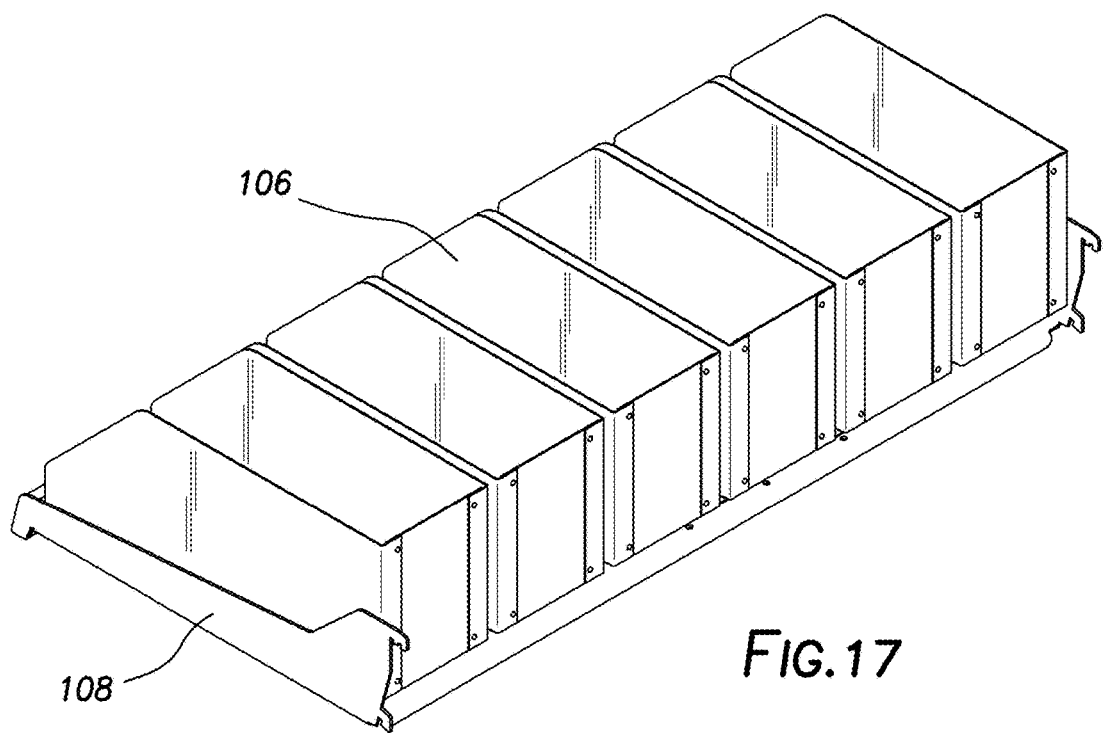

FIG. 17 depicts a rear view of the fixture of FIG. 16.

Figure 18:
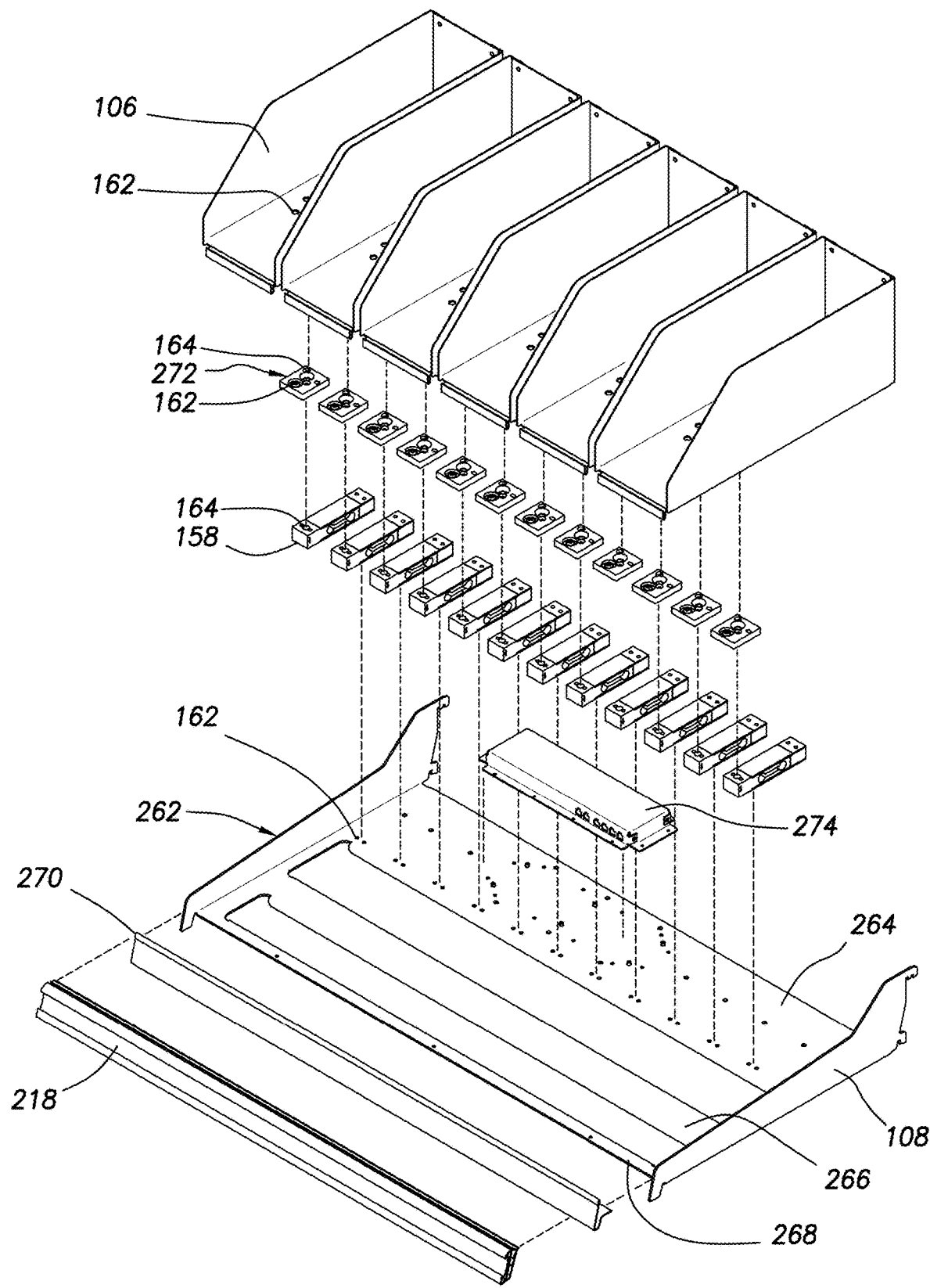

FIG. 18 depicts an exploded view of the fixture of FIG. 16. The accessories 106 include one or more holes. For example, unthreaded holes 162 may be arranged within a bottom or floor of the accessory 106 to facilitate engagement to an accessory mounting block 272. The accessory mounting block 272 may include one or more threaded holes 164 configured to engage a screw that is inserted through the holes 162 of the accessory 106, joining the accessory mounting block 272 to the accessory 106.

The accessory mounting block 272 may include one or more unthreaded holes 162 through which fasteners such as screws may be inserted and used to engage one or more threaded holes 164 in a first end of the load cell 158. The accessory mounting block 272 may be used to provide additional clearance between the load cell 158 and the bottom of the accessory 106. The accessory mounting block 272 may also facilitate the adjustment or changeout of accessories 106, acting as an intermediate element to reduce the potential for damage to the load cell 158 during accessory 106 changeout. In some implementations, the accessory mounting block 272 may be mounted to the accessory 106 between a front edge of the accessory 106 and a midpoint between the front edge and a rear edge of the accessory 106.

Utilization of the accessory mounting blocks 272 facilitates reconfiguration of the fixture. For example, in some implementations a wider accessory 106 may be used. It may be desirable to have the accessory 106 span several load cells 158 without being engaged thereto. Continuing the example, the accessory 106 may be affixed to a single accessory mounting block 272, and thus to a corresponding load cell 158, while the other accessory mounting blocks 272 underneath are removed. In this configuration, the weight on the accessory 106 is measured using a single load cell 158. In another example, the accessory 106 may span three or more load cells. The accessory 106 may be affixed to accessory mounting blocks 272 on each end, while the accessory mounting block 272 in the middle is removed.

The fixture depicted includes a frame 262 that includes a rear crosspiece 264, a middle crosspiece 266, and a front crosspiece 268. These crosspieces extend from a left bracket 108 to a right bracket 108. In some implementations, the crosspieces 264, 266, 268 and the brackets 108 may comprise a single piece of material that has been formed into the desired shape. A front stop 270 is affixed to a front of the fixture, such as via fasteners to the front crosspiece 268. A ticket channel 218 may be joined to one or more of the front stop 270, the front cross piece 268, and the brackets 108. In some implementations the crosspieces may have a non-planar cross section. For example, the rear crosspiece 264 may include one or more bends to form a "C" or "U" cross section that increases the stiffness of the rear crosspiece 264.

An electronics cover 274 provides protection for electronics associated with the fixture. For example, a circuit board may include analog-to-digital converters that accept signals from the load cells 158 and generate load cell data. The circuit board may include a communication interface that then transmits the load cell data to an external device. In some implementations the electronics cover 274 may enhance electromagnetic compatibility, such as by providing shielding for radiated signals.

The rear crosspiece 264 may include one or more holes or other mechanical mounting features. A second end of the load cell 158 is mounted to the rear crosspiece 264. For example, one or more removeable fasteners such as bolts or screws may be used to join the second end of the load cell 158 to the rear crosspiece 264.

Figure 19:
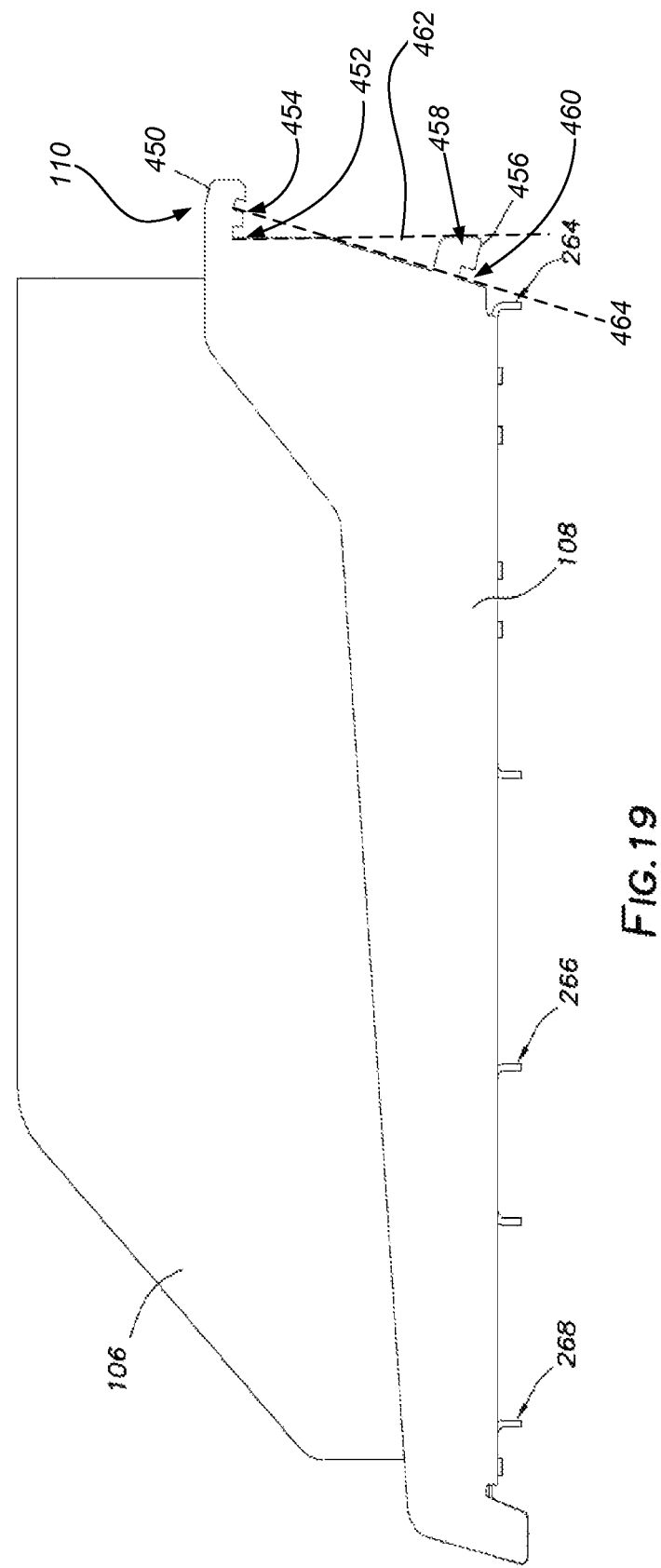

FIG. 19 depicts a side view of the fixture of FIG. 16. A side wall of the accessory 106 bin is visible, along with a bracket 108 and the engagement features 110 on the bracket 108. The rear crosspiece 264, middle crosspiece 266, and the front crosspiece 268 may include bends or features as shown here that extend downwards. These features may increase the stiffness of the crosspieces and the overall fixture.

The engagement features 110 of the bracket 108 may be configured to allow for mounting to a gondola or other support structure in two configurations. In a first configuration, the bracket 108 is engaged such that the fixture is substantially horizontal. For example, in this first configuration the bottom of the accessory 106 may be horizontal. In a second configuration, the bracket 108 is engaged such that the fixture is angled, such that the front edge of the bracket 108 is lower than the rear edge of the bracket 108.

The engagement features 110 may include an upper engagement tab 450. The upper engagement tab includes two notches: a proximal notch 452 and a distal notch 454. The proximal notch 452 is closest to a body of the bracket 108 while the distal notch 452 is closer to a tip of the upper engagement tab 450. The notches 452 and 454 may be rectangular in cross section. The notches 452 and 454 are arranged at an angle relative to one another. For example, the interior proximal sides of the notches 452 and 454 may be angled with respect to one another, such that the proximal notch 452 is arranged vertically while the distal notch 454 is at an angle relative to vertical. The engagement features 110 may also include a lower engagement tab 456. The lower engagement tab 456 includes a distal surface 458 and a notch 460. The distal notch 454 and the notch 460 are aligned with one another. For example, the interior proximal surface of the distal notch 454 and the interior proximal surface of the notch 460 are collinear with one another. The proximal notch 452 is aligned with the distal surface 458. For example, the interior proximal surface of the proximal notch 452 may be aligned with the distal surface 458.

A horizontal mount engagement line 462 is depicted, showing the approximate position of a portion of a gondola or upright to which the engagement features 110 engage in the first configuration. When mounted in the first configuration, as shown by line 462, the proximal notch 452 of the upper engagement tab 450 engages the gondola while the distal surface 458 of the lower engagement tab 456 rests against a surface of the gondola.

An angled mount engagement line 464 is depicted, showing the approximate position of a portion of a gondola or upright to which the engagement features engage in the second configuration. When mounted in the second configuration, as shown by line 464, the distal notch 454 of the upper engagement tab 450 engages a first portion of the gondola while the notch 460 of the lower engagement tab 456 also engages a second portion of the gondola.

This arrangement of engagement features 110 allows for improvement in the installation, removal, and reconfiguration of fixtures. For example, compared to conventional engagement mechanisms, the fixture as described may be added to or removed from between adjacent fixtures or other structures without the need to tilt the fixture at an extreme angle. Additionally, the fixture may be quickly reconfigured from horizontal to angled mounting. This allows for greater flexibility in reconfiguring for stowing and presenting items.

This arrangement of engagement features 110 may be used with respect to any of the fixtures described in this disclosure, for conventional shelves, and so forth.

Figure 20:
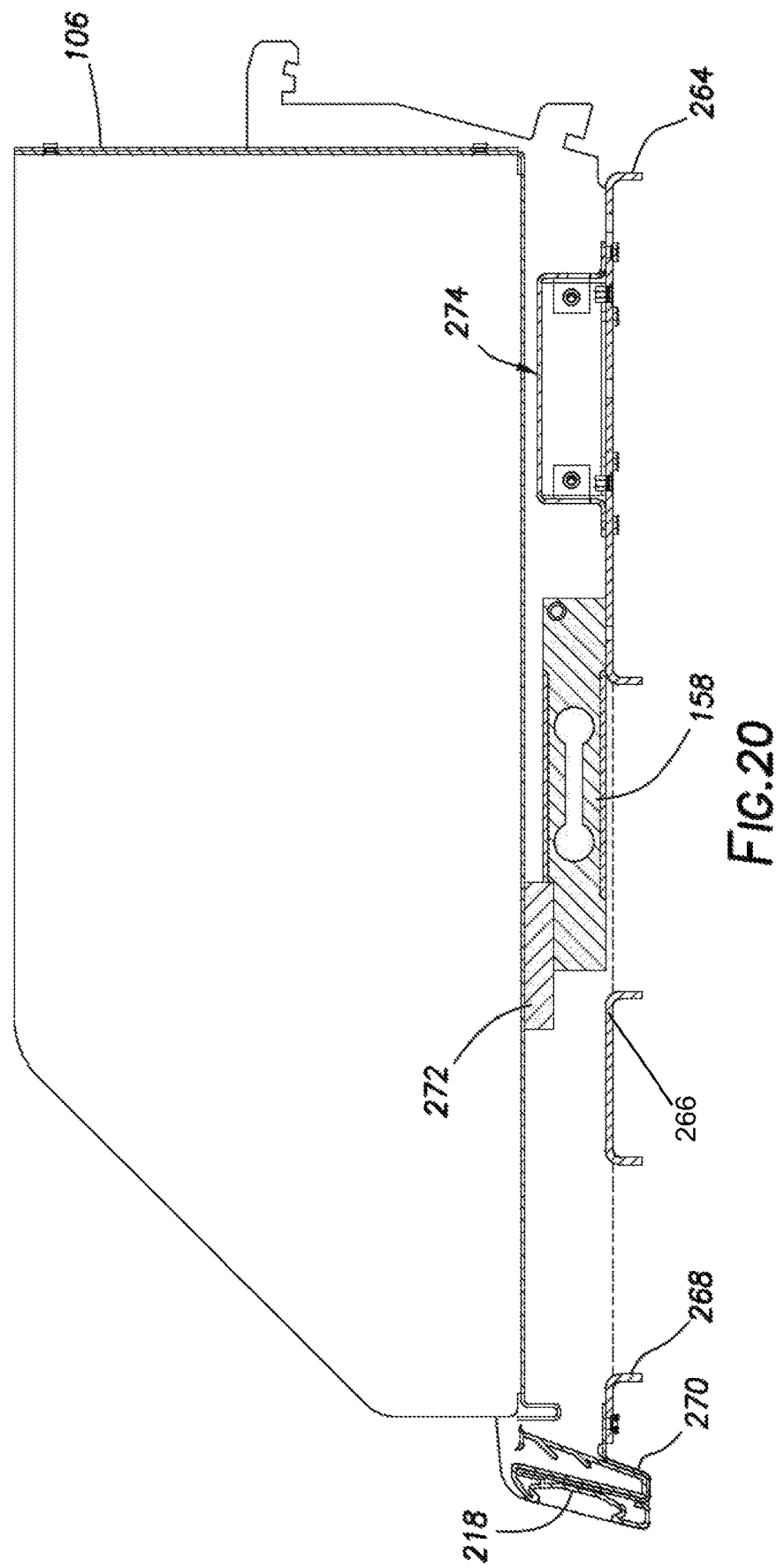

FIG. 20 depicts a cross section of the fixture of FIG. 16. As shown in this illustration, the load cell 158 may be mounted such that the first end of the load cell 158 is joined to the accessory mounting block 272 while the second end of the load cell 158 is joined to a front portion of the rear crosspiece 264. When installed, the leading or front edge of the load cell 158 does not reach as far as a trailing or back edge of the middle crosspiece 266. During use, as the load cell 158 deflects under changes in the load on the accessory 106, the first end of the load cell 158 may move into the space that is between rear crosspiece 264 and the middle crosspiece 266.

The accessory mounting block 272 provides additional clearance or height, providing room for the load cell 158 to deflect while providing clearance from a top surface of the electronics cover 274 and a bottom surface of the accessory 106.

Also shown is the front stop 270 that is affixed to the front crosspiece 268. Mounted to the front stop is the ticket channel 218. There is a gap or clearance between a leading edge of the accessory 106 and a trailing edge of the front stop 270. This gap allows the accessory 106 to move with respect to the front stop 270 as the weight on the accessory 106 changes.

In other implementations, other arrangements may be utilized. For example, the cross member between the brackets 108 may be a channel within which the load cells 158 are mounted.

Figure 21:
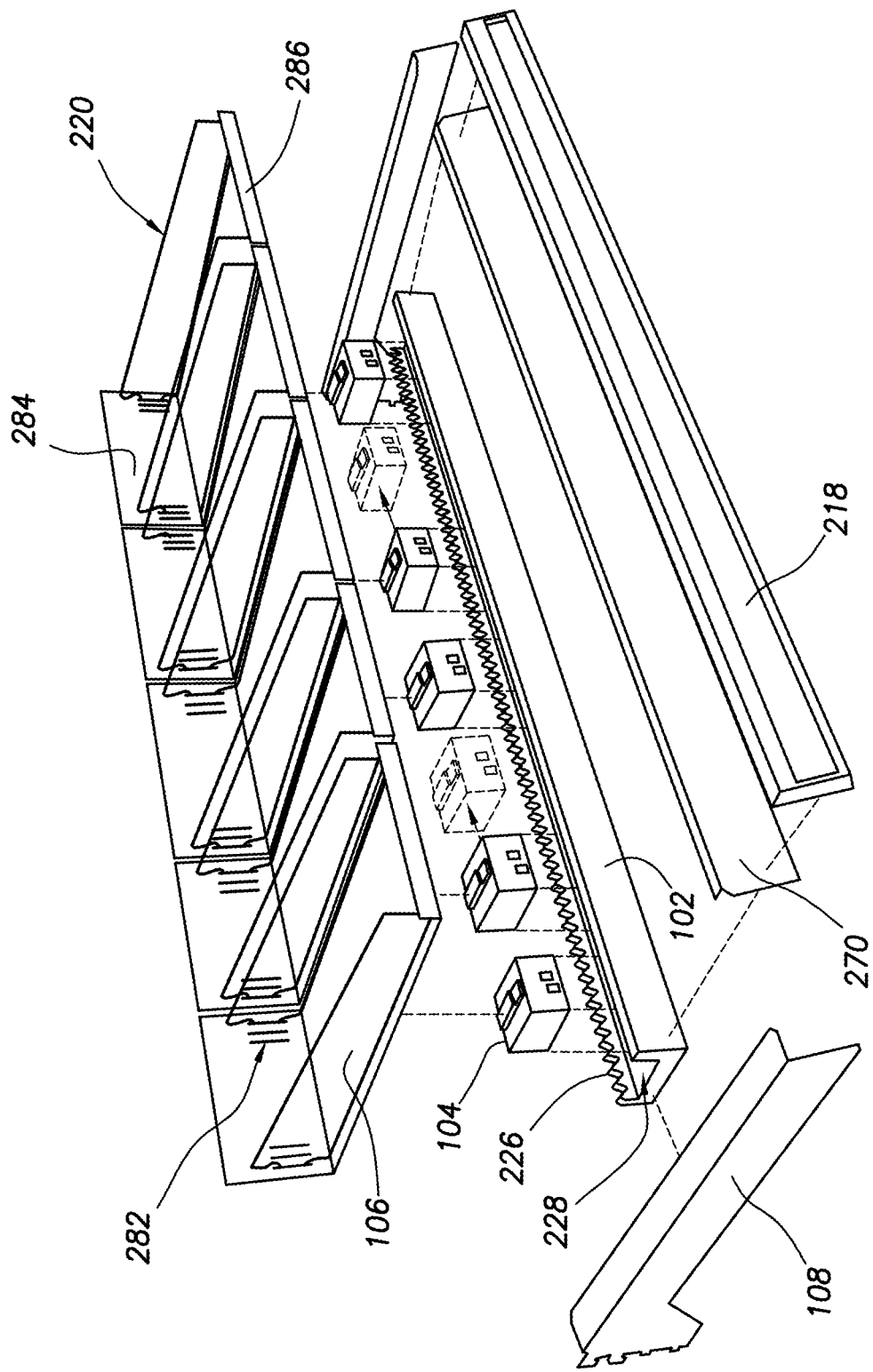
FIG. 21 illustrates a view of a fixture with a modular weighing module that may be moved with respect to a crossbar, according to some implementations.

FIG. 21 illustrates a view of a fixture with a modular weighing module that may be moved with respect to a crossbar, according to some implementations. In this illustration, weighing modules 104 may be inserted into a crossbar channel 228 at a desired lateral position between the left end and right end of the crossbar 102. The crossbar 102 is supported by brackets 108. One or more crossbar engagement features 226 extend from left to right along a rear wall of the crossbar channel 228. For example, the crossbar engagement features 226 may comprise crenellations or teeth extending upward.

The fixture may include a front stop 270 and a ticket channel 218.

The weighing module 104 is below the accessory 106 and the accessory 106 is mounted to the load cell 158 of the weighing module 104. The position of the weighing module 104 is between a front and a back of the accessory 106. For example, the load cell 158 may attach to the accessory 106 at a midpoint between the front and back of the accessory 106.

The accessory 106 may include an accessory back wall 284 and an accessory front lip 286. The accessory back wall 284 extends up from the surface of the trailing edge of the accessory 106. The accessory front lip 286 extends up from the surface of the leading edge of the accessory 106.

Wire guides 220 may be used on one or more sides of the accessory 106. The accessory back wall 284 may include wire guide slots 282 that allow for the wire guides 220 to be repositioned with respect to a particular accessory 106. For example, a pair of wire guides 220 may be moved together to accommodate narrower items or may be moved apart to accommodate wider items.

Figure 22:
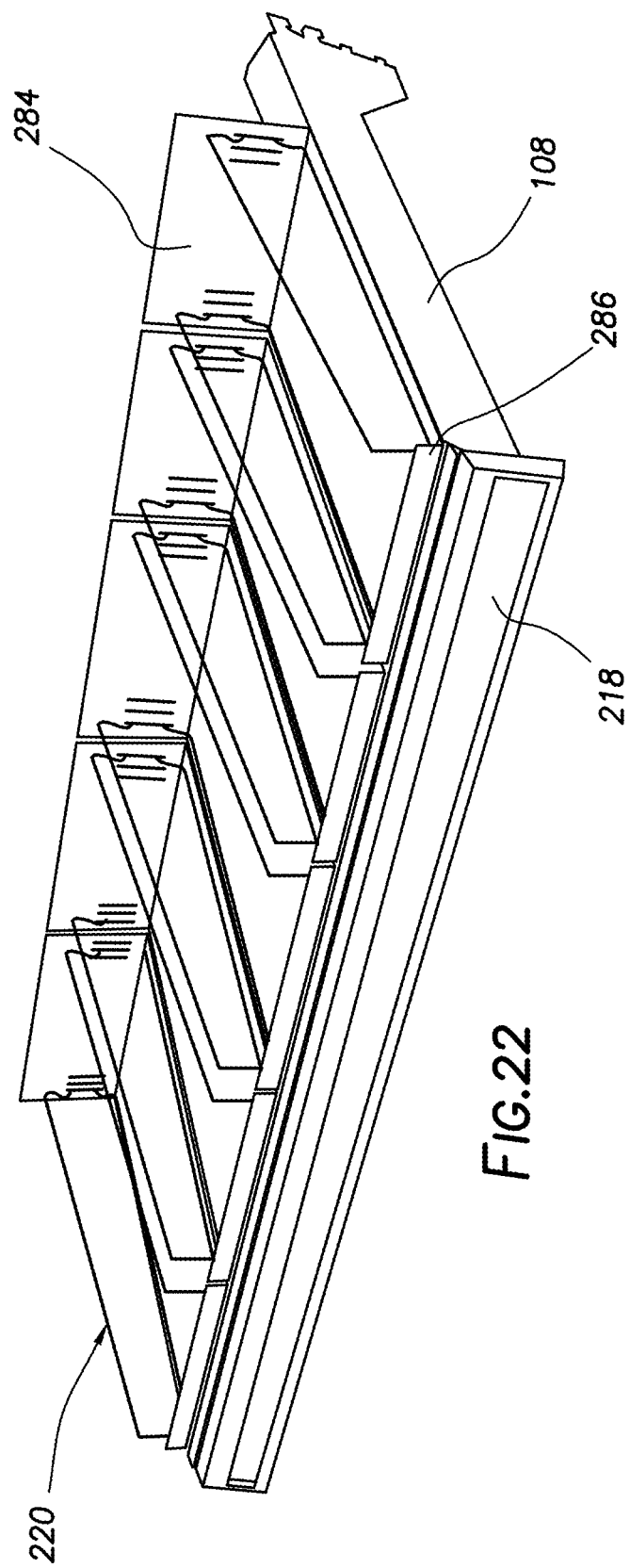
FIG. 22 illustrates a view of a fixture with modular weighing modules affixed to a crossbar, according to some implementations.

FIG. 22 illustrates a view of a fixture with modular weighing modules affixed to a crossbar, according to some implementations. This fixture utilizes weighing modules 104 that are affixed to a crossbar 102 (not shown) that extends from a left bracket 108 to a right bracket 108. In comparison, the fixture of FIG. 21 allows for the weighing modules 104 to be moved laterally as designed to change the spacing between weighing modules 104.

The accessories 106 may include an accessory back wall 284 and an accessory front lip 286. Wire guides 220 may be installed to facilitate retention of items within respective ones of the accessories 106. A ticket channel 218 is also shown.

FIGS. 23-27 illustrate views of a crossbar with modular weighing module 104 supporting a cantilevered hanger from which items may be suspended, according to some implementations.

Figure 23:
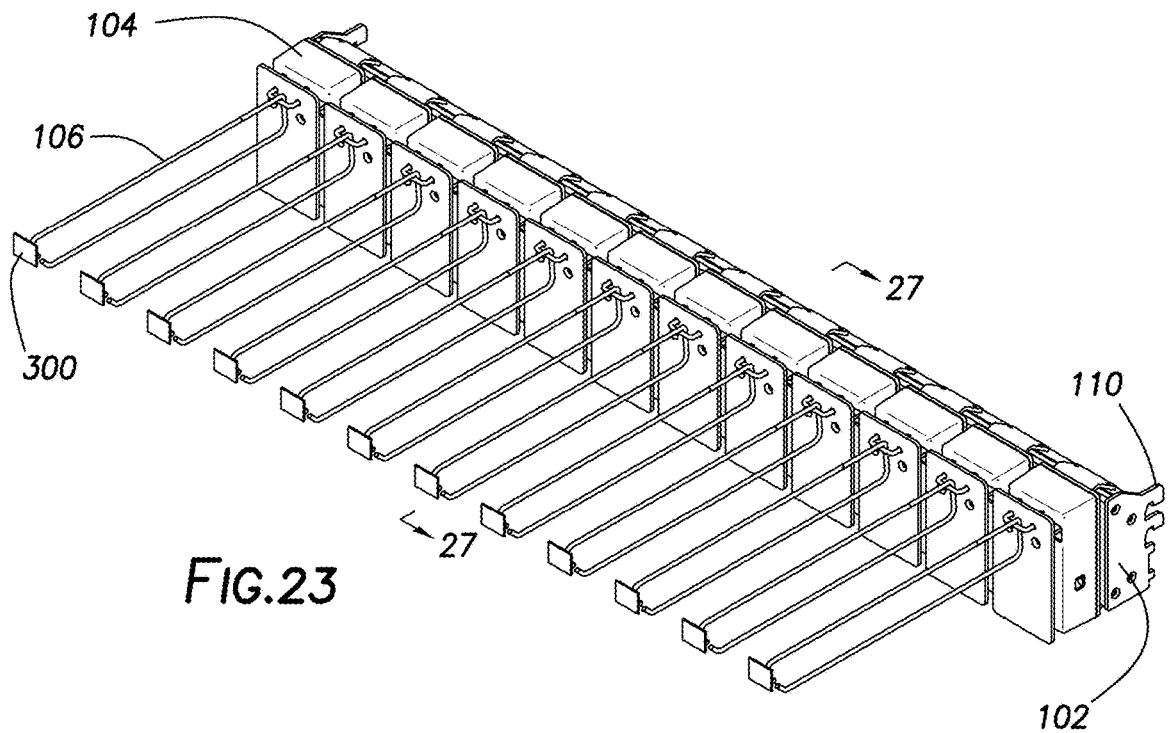
FIGS. 23-27 illustrate views of a crossbar with a modular weighing module supporting a cantilevered hanger from which items may be suspended, according to some implementations.

FIG. 23 depicts a front view of the fixture showing accessories 106 comprising hangers that cantilever away from the weighing module 104. The weighing modules 104 are mounted to a crossbar 102. Engagement features 110 extend from a left end and a right end of the crossbar 102, allowing the crossbar to be mounted to another structure, such as the uprights of a gondola. Tag holders 300 are shown at the leading tip of the accessory 106 hanger. For example, the tag holder 300 may hold a printed tag showing price, item number, and so forth.

Figure 24:
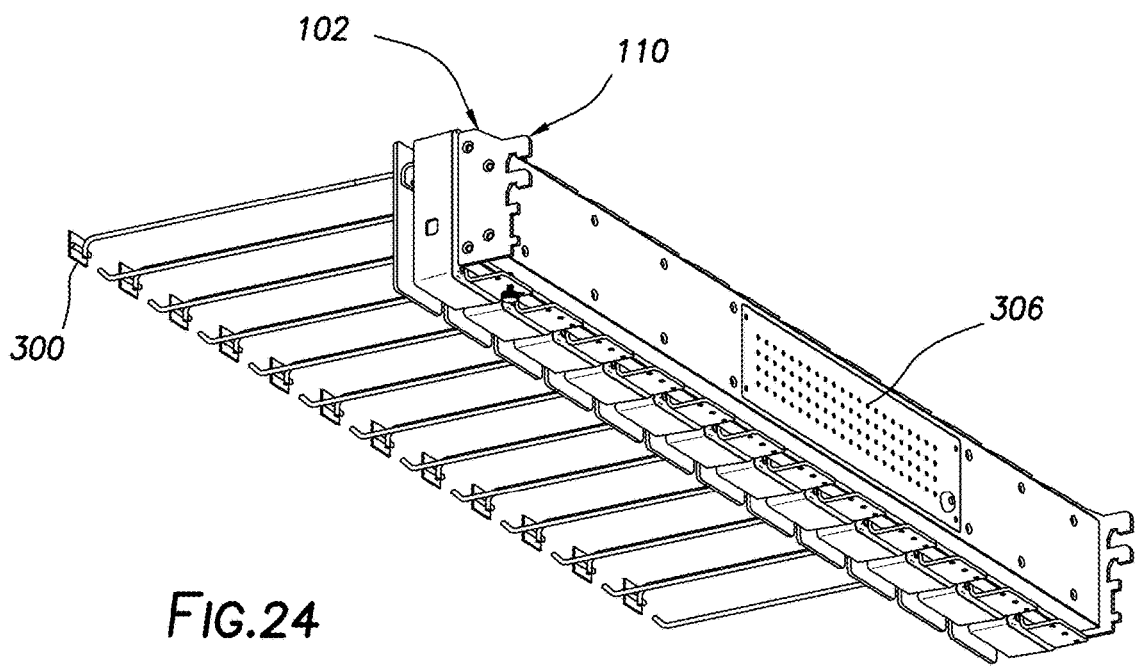

FIG. 24 shows a rear view of the fixture of FIG. 23. A vent 306 is shown. The vent 306 provides air circulation to facilitate cooling of electronics within the crossbar 102.

Figure 25:
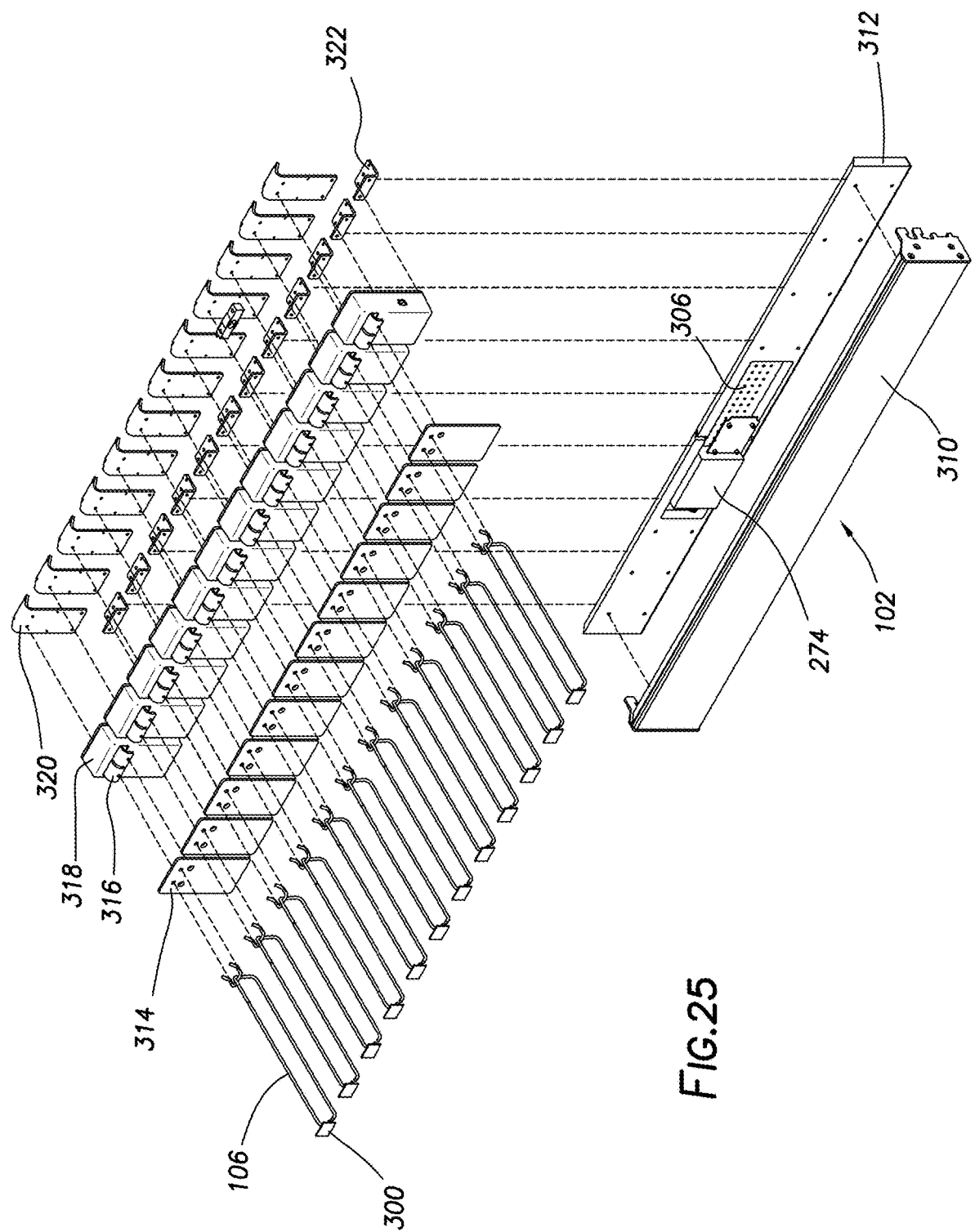

FIG. 25 shows an exploded view of the fixture of FIG. 23. The accessory 106 hanger may be affixed to the weighing module 104 by inserting one or more prongs into corresponding holes in a front plate 314. This allows the weighing module 104 to easily be reconfigured to support hangers of different sizes. The front plate 314 is attached to, or part of, a bracket 316 that, in turn, is affixed to a first end of the load cell 158. A cover 318 of the weighing module 104 provides an exterior to the weighing module 104, protecting the interior components. A hole in the cover 318 allows the bracket 316 to exit from the cover 318 while not restricting movement of the bracket 316. The cover 318 is mounted to structures in the weighing module 104 other than the load cell 158.

An upper mounting bracket 320 is affixed to a rear wall of the weighing module 104. A lower mounting bracket 322 is affixed to the rear wall of the weighing module 104, below the upper mounting bracket 320.

The crossbar 102 comprises a crossbar front 310 and a crossbar backpiece 312. An electronics cover 274 within the crossbar 102 may contain the electronics associated with operation of the fixture.

Figure 26:
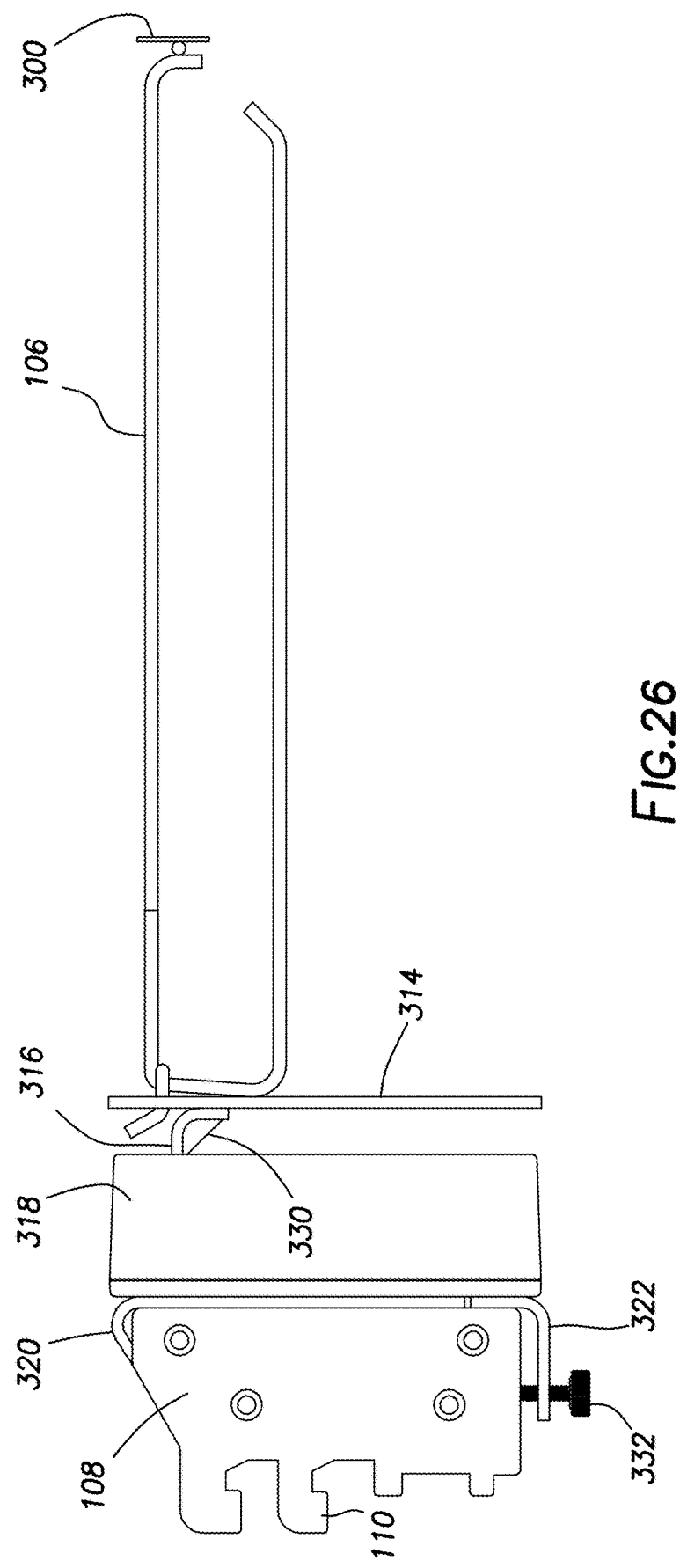

FIG. 26 shows a side view of the weighing module 104 of the fixture of FIG. 23. In this view prongs of the accessory 106 hanger are visible, mechanically engaging the accessory 106 to the front plate 314. The front plate 314 in turn is attached to a forward portion of the bracket 316. The bracket 316 may include one or more stiffening features 330. These stiffening features 330 may include cross braces, bends, folds, and so forth. By including the stiffening features 330 in the bracket 316, in this cantilevered configuration the mechanical oscillation may be reduced. This reduction may improve the quality of the load cell data produced by the load cell 158.

The upper mounting bracket 320 of the weighing module 104 extends over the top of the crossbar 102, while the lower mounting bracket 322 extends back away from the weighing module 104, underneath at least a portion of the crossbar 102. The lower mounting bracket 322 may include one or more screws 332. For example, the screw may comprise a thumbscrew 332 that may be tightened to provide mechanical engagement with a portion of the underside of the crossbar 102.

Figure 27:
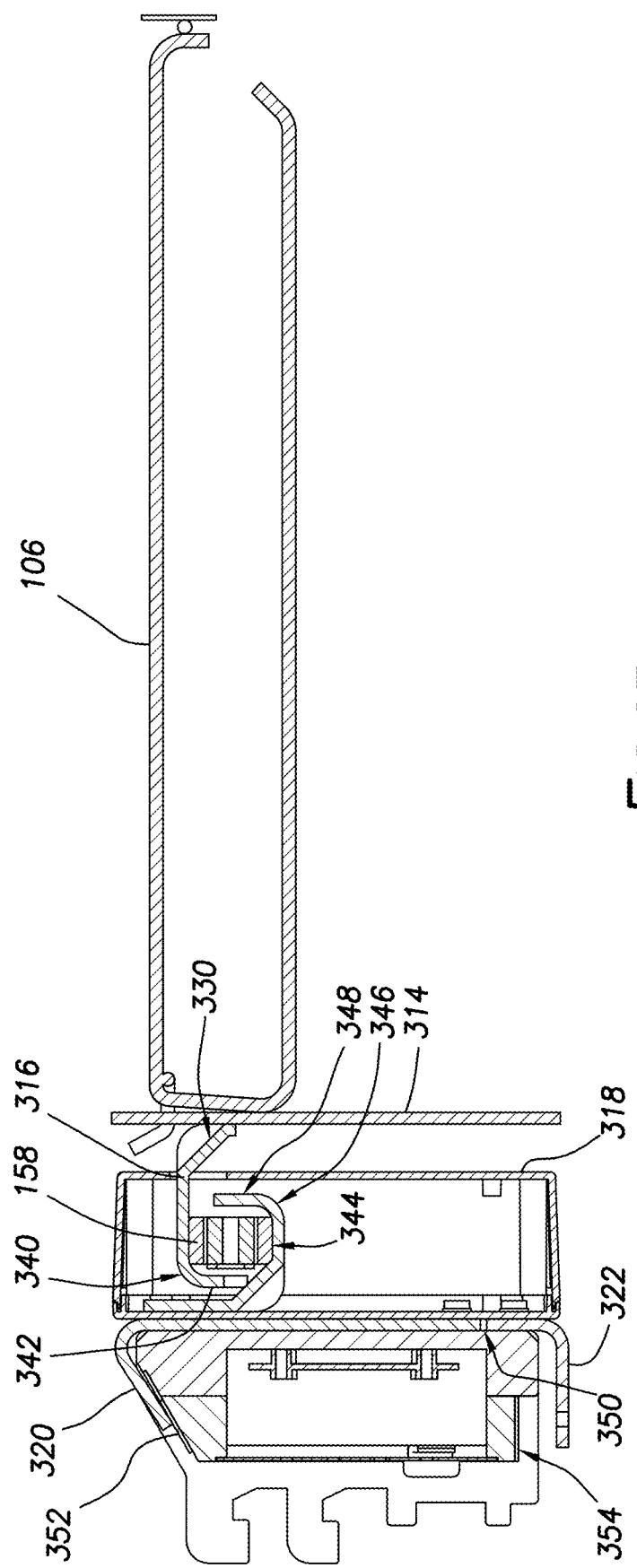

FIG. 27 shows a cross section of the weighing module of FIG. 26. A front portion of the bracket 316 joins to the front plate 314. The bracket 316 extends horizontally back to the load cell 158. An upper surface of a first end of the load cell 158 is joined to an underside of the bracket 316. For example, removeable fasteners such as bolts or screws may be used. The bracket 316 may have a bend 340 that forms a lip 342. The lip 342 may increase the stiffness of the bracket 316.

A lower surface of a second end of the load cell 158 is joined to an upper surface of a support bracket 344. The support bracket 344 mounts to a rear wall of the weighing module 104. The support bracket 344 may include one or more stiffening features 330, such as described above. The load cell 158 may comprise a single point load cell. In the implementation depicted here, the long axis of the load cell 158 is perpendicular to the load, in this case the accessory 106. The torsion and off-axis load introduced by this configuration are well tolerated with the use of the single point load cell, and allow for a more compact arrangement of the weighing module 104.

In cross section, the cross section of the crossbar 102 is asymmetric. For example, the shape of the crossbar 102 as shown in this figure includes a slope that extends downward away from the front of the crossbar 102. The upper mounting bracket 320 is configured with a corresponding shape, allowing the weighing module 104 to hang from the crossbar 102.

One or more upper conductors 352 may be arranged along the slope of the upper portion of the crossbar 102. Similarly, one or more lower conductors 354 may be arranged along an underside of the crossbar 102. These conductors may be used to transfer one or more of electrical power, signals, and so forth.

The upper mounting bracket 320 and the lower mounting bracket 322 may be separated by a gap 350 or insulator, with each acting as an electrically conductive pathway. When installed, the upper mounting bracket 320 provides a conductive pathway from electronics in the weighing module 104 to the upper conductor 352. The lower mounting bracket 322 with the screw 332 provides a conductive pathway from the electronics to the lower conductor 354.

In other implementations, electrical connections between the weighing module 104 and the crossbar 102 may be provided as described above, using the circuit board 122 on the crossbar 102 and corresponding weighing module connectors 202 on the weighing module 104.

FIGS. 28-33 illustrate views of a crossbar 102 with modular weighing module 104 supporting a cantilevered hanger, according to some implementations. In these implementations, the body of the weighing module 104 is behind the crossbar 102.

Figure 28:
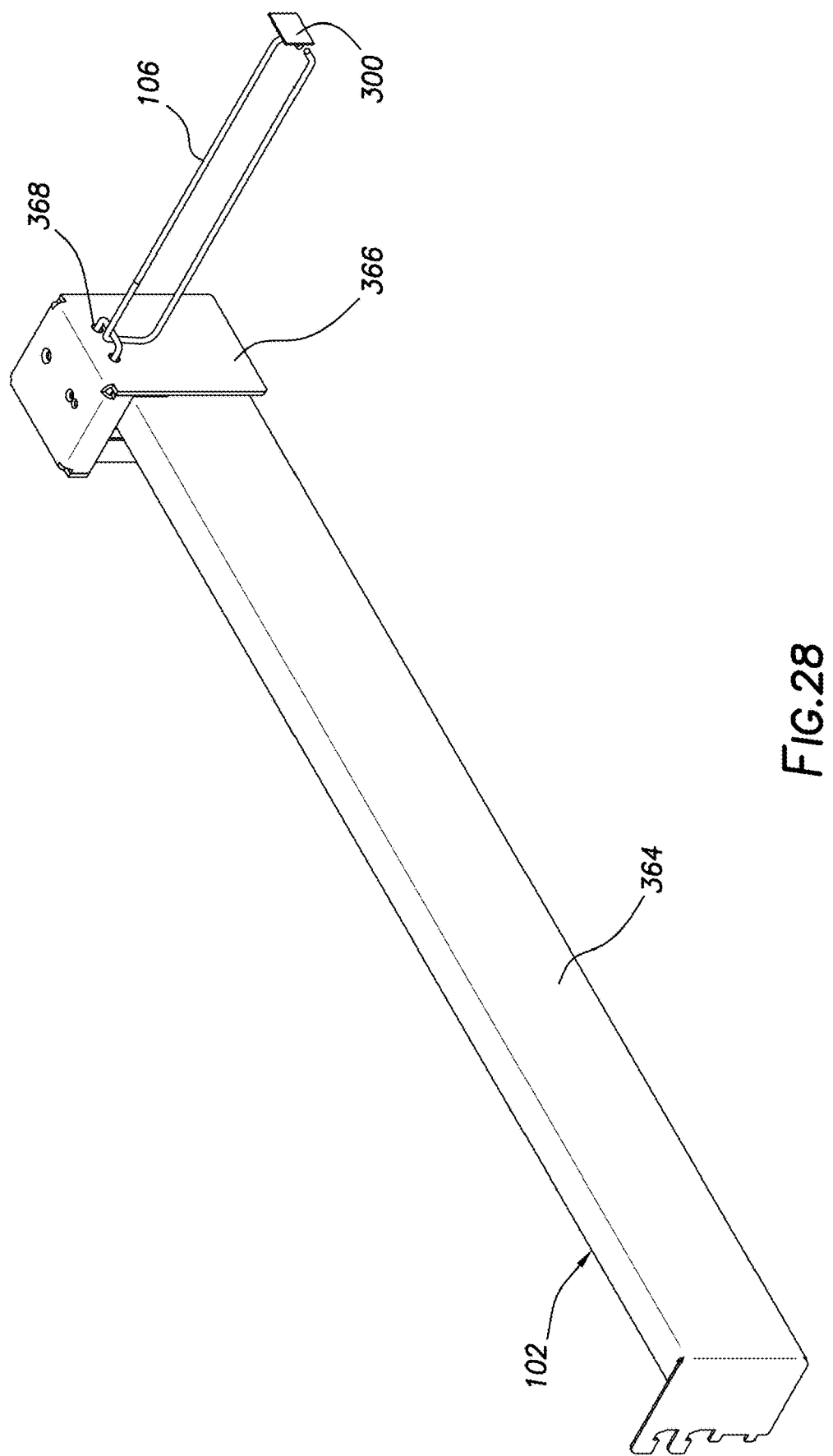
FIGS. 28-33 illustrate views of a crossbar with a modular weighing module supporting a cantilevered hanger, according to some implementations.

FIG. 28 shows a front view of the fixture with a crossbar 102. A weighing module 104 has a front cover 366. The front cover 366 includes one or more hanger holes 368 in a vertical surface of the front cover 366. The hanger holes 368 are configured to accept the prongs of an accessory 106 such as a hanger. The front cover 366 of the weighing module 104 extends downward to cover at least a portion of a crossbar front 364. However, in this fixture, the weighing module 104 does not engage a front vertical surface of the crossbar front 364.

Figure 29:
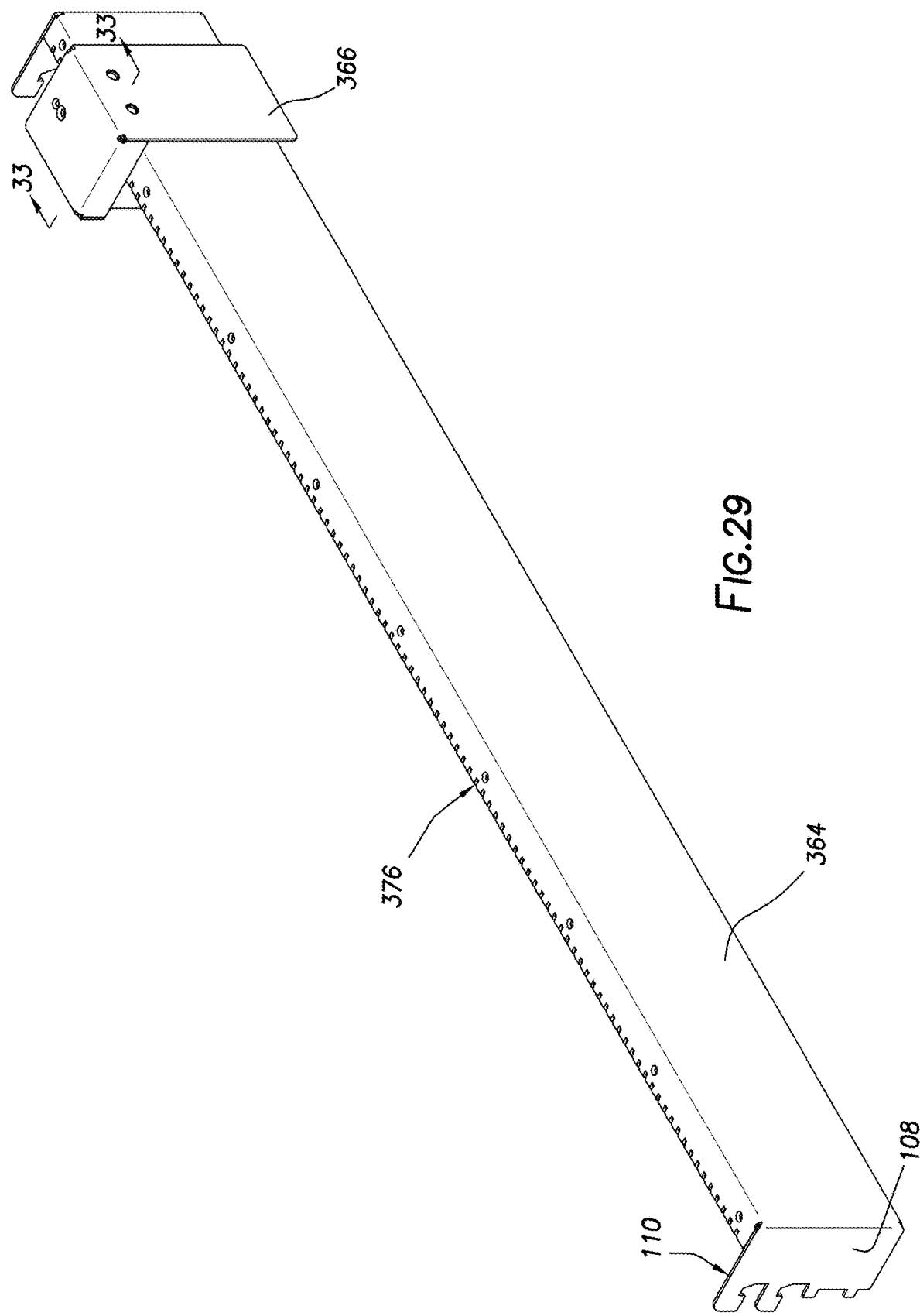

FIG. 29 shows a front view of a variation of the fixture in which the crossbar 102 includes upper engagement features 376. The upper engagement features 376 may include slots, tabs, and so forth. When installed, the weighing module 104 is configured to engage at least a portion of these upper engagement features 376.

Figure 30:
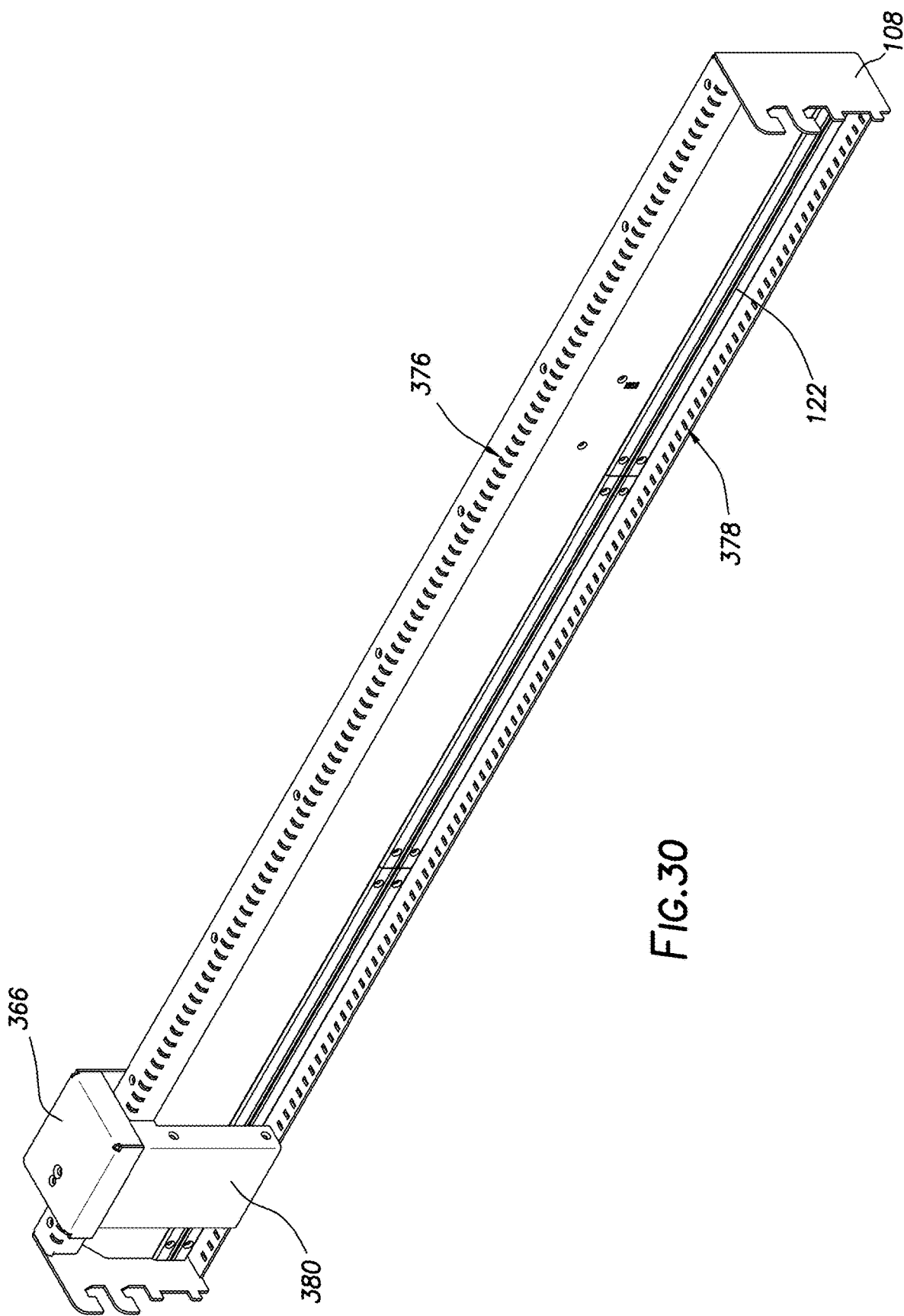

FIG. 30 shows a rear view of the fixture of FIG. 29, showing the upper engagement features 376 and lower engagement features 378. Also shown is the circuit board 122. A module back cover 380 of the weighing module 104 is also shown, along with a top or cap of the front cover 366.

Figure 31:
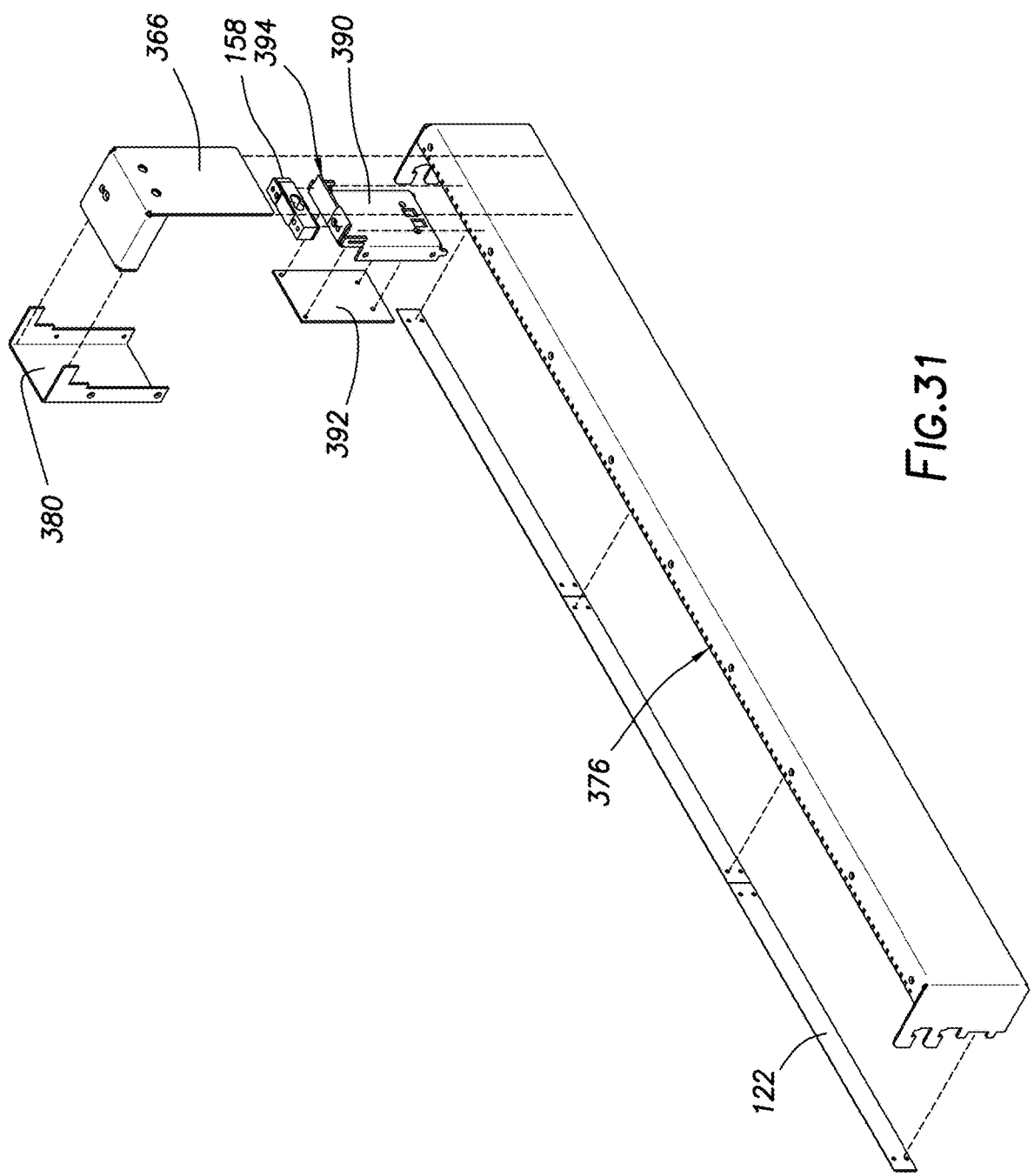

FIG. 31 shows an exploded view of the fixture of FIG. 29. The module back cover 380 fits behind and below the front cover 366. The front cover 366 is affixed to a first end of the load cell 158. A second end of the load cell 158 is affixed to a horizontal portion of an internal front piece 390 of the weighing module 104. An internal backpiece 392 in turn may be affixed to the internal front piece 390.

One or more module engagement features 394 may extend from the internal front piece 390. For example, the module engagement features 394 may comprise tabs that protrude from the weighing module 104 and are configured to engage upper engagement features 376 comprising slots.

Figure 32:
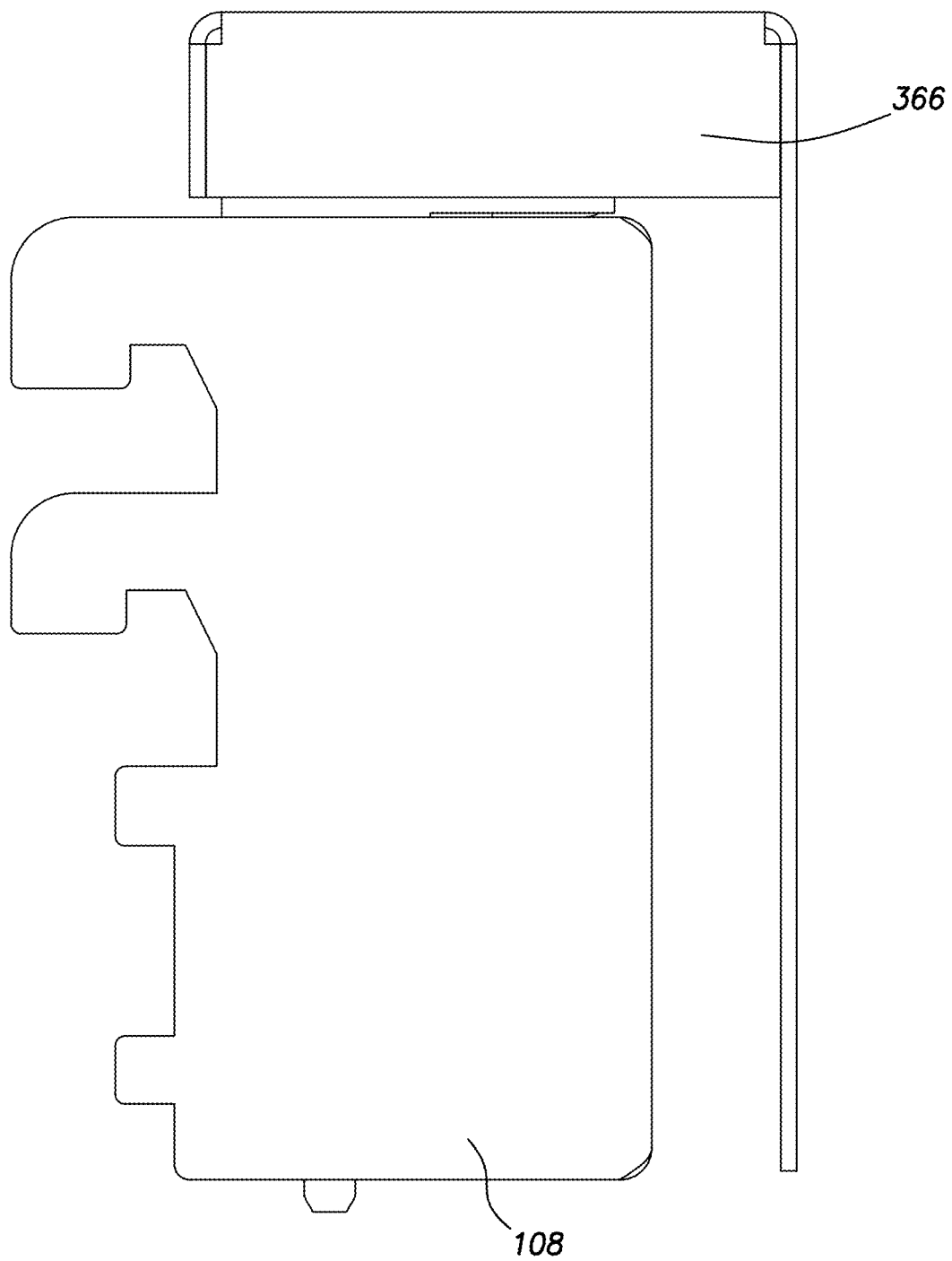

FIG. 32 depicts a side view of the fixture of FIG. 29. The bracket 108 is shown along with the front cover 366.

Figure 33:
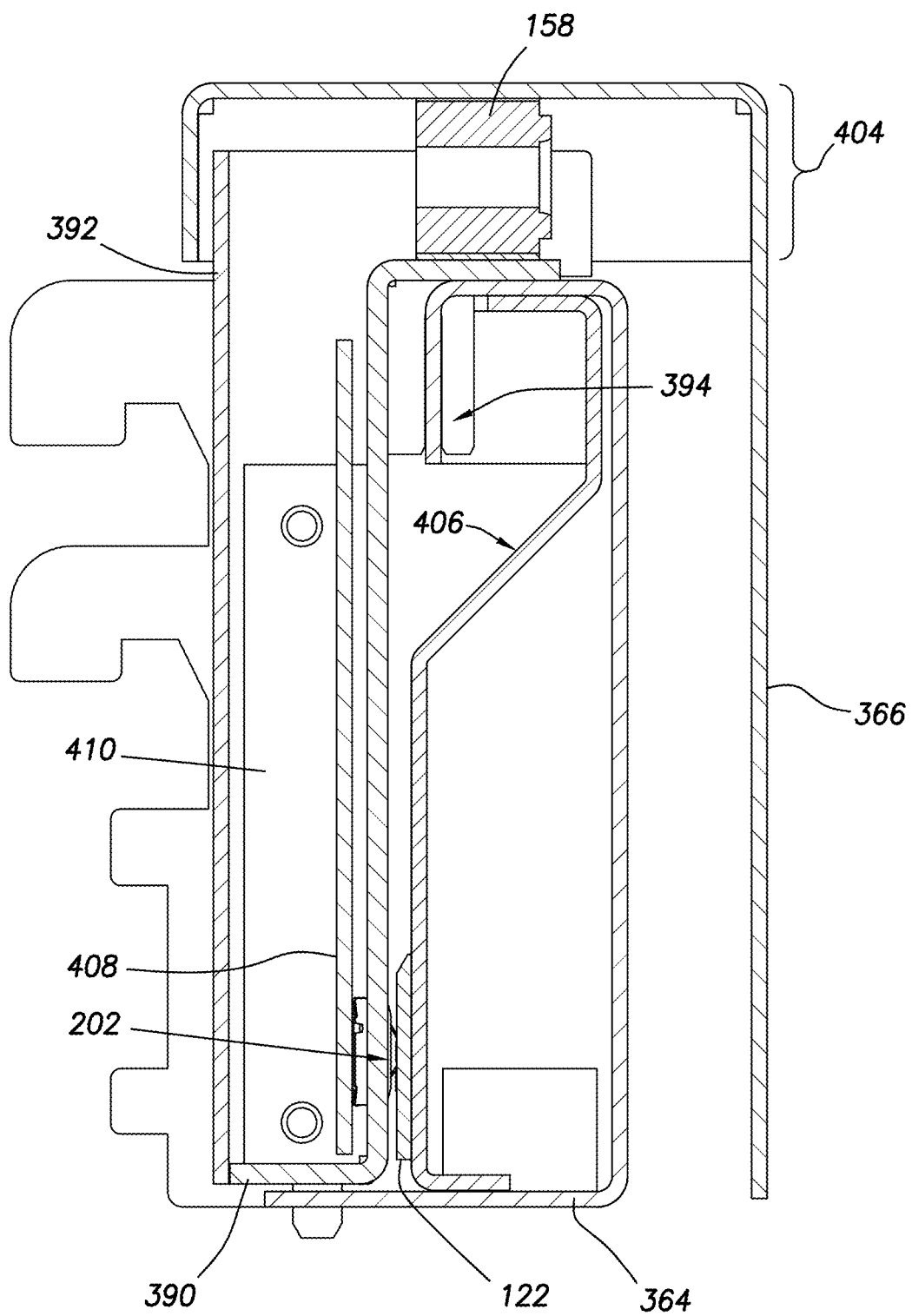

FIG. 33 depicts a cross section of the fixture of FIG. 29. The front cover 366 is bent or otherwise formed to create a cap 404. A horizontal portion of the cap 404 is affixed to a first end of the load cell 158. When a load is applied to the hanger that is hanging from front cover 366, the load cell 158 is deflected. In the implementation shown here, the front cover 366 comprises a single piece of material. One or more stiffening features may be included to improve the stiffness of the front cover 366.

Compared to some of the other fixtures described herein, the front cover 366 of the weighing module 104 does not come into contact with a front vertical surface of the crossbar front 364. A gap is present between the front vertical surface of the crossbar front 364 and the front cover 366. Instead, the weighing module 104 remains engaged with the crossbar 102 by way of the upper engagement features 376 and the lower engagement features 378, as well as the cantilevering action provided by the load on an accessory 106.

A second end of the load cell 158 is affixed to the horizontal portion of the internal front piece 390. As described above, the load cell 158 may be affixed to other members using one or more removeable fasteners. A weighing module connector 202 may be mounted to or within the internal front piece 390, on a front surface facing towards the crossbar 102 when installed. When installed, the weighing module connector 202 comes into contact with the electrical conductors on the circuit board 122 of the crossbar 102.

Visible is a module engagement feature 394 that is within one of the upper engagement features 376. The crossbar 102 may include a slope 406 that extends downwards from a front of the crossbar 102 to a back.

The internal backpiece 392 encloses at least some of the parts of the weighing module 104, such as the electronics 408. A bracket 410 may extend from the internal front piece 390 and provides an attachment point for the internal back piece 392.

The implementations described above are provided for illustration, and not necessarily as limitations. For example, the fixtures may support different numbers of accessories 106, combinations of different accessories on the same fixture, and so forth.

Figure 34:
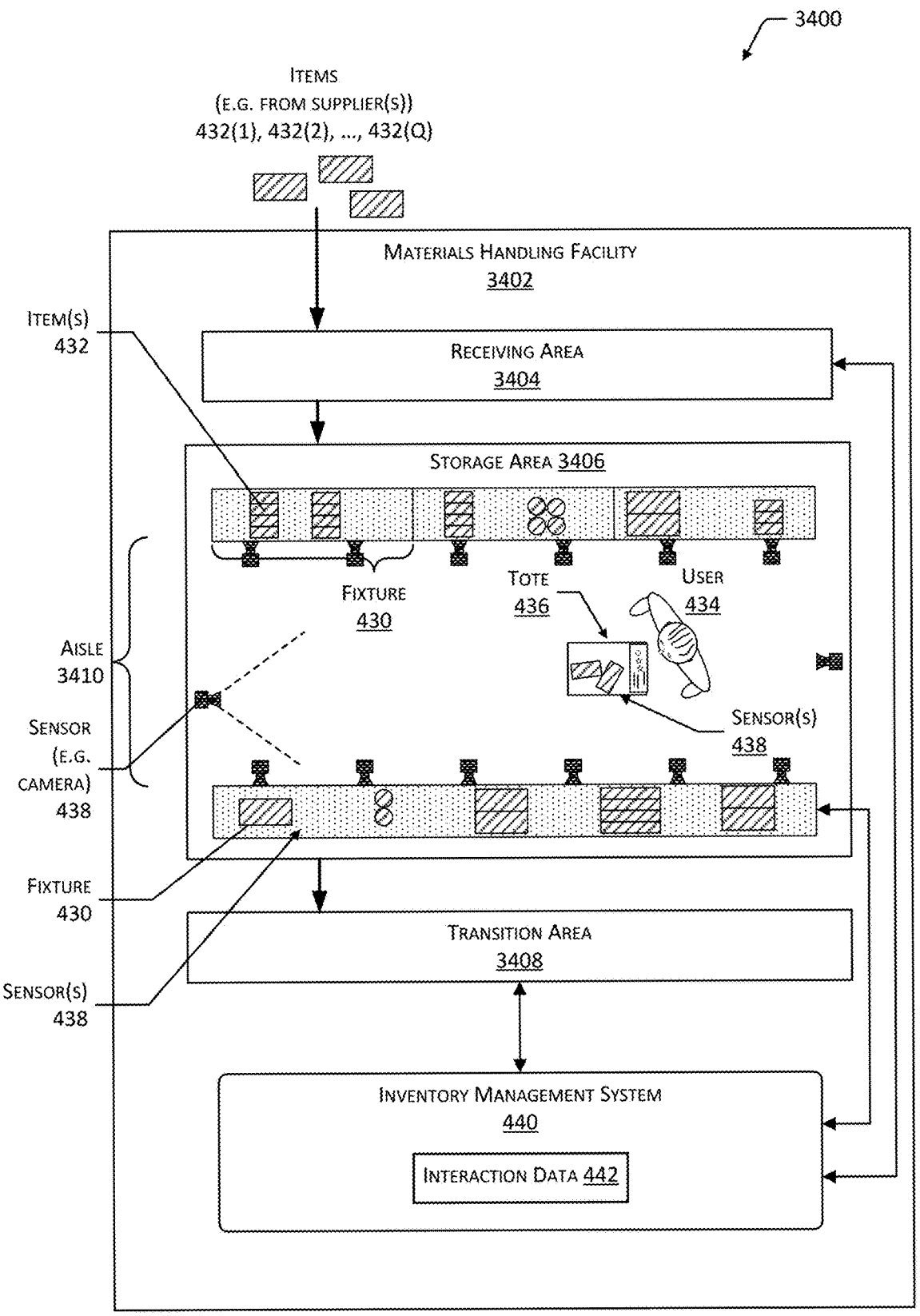
FIG. 34 is a block diagram illustrating a materials handling facility (facility) using the system, according to some implementations.

FIG. 34 is a block diagram 3400 illustrating a materials handling facility (facility) 3402 using the system, according to some implementations. A facility 3402 comprises one or more physical structures or areas within which one or more items 432(1), 432(2), . . . , 432(Q) may be held. As used in this disclosure, letters in parenthesis such as "(Q)" indicate an integer value greater than or equal to zero. The items 432 may comprise physical goods, such as books, pharmaceuticals, repair parts, electronic gear, and so forth.

The facility 3402 may include one or more areas designated for different functions with regard to inventory handling. In this illustration, the facility 3402 includes a receiving area 3404, a storage area 3406, and a transition area 3408.

The receiving area 3404 may be configured to accept items 432, such as from suppliers, for intake into the facility 3402. For example, the receiving area 3404 may include a loading dock at which trucks or other freight conveyances unload the items 432. In some implementations, the items 432 may be processed, such as at the receiving area 3404, to generate at least a portion of the item data. For example, an item 432 may be imaged or otherwise scanned to develop reference images or representations of the item 432 at the receiving area 3404.

The storage area 3406 is configured to store the items 432. The storage area 3406 may be arranged in various physical configurations. In one implementation, the storage area 3406 may include one or more aisles 3410. The aisle 3410 may be configured with, or defined by, fixtures 430 such as those described above that are arranged along one or both sides of the aisle 3410. The fixtures 430 may also be movable such that the arrangements of aisles 3410 may be reconfigurable. In some implementations, the fixtures 430 may be configured to move independently of an outside operator. For example, the fixtures 430 may comprise a rack with a power source and a motor, operable by a computing device to allow the rack to move from one location within the facility 3402 to another.

One or more users 434(1), 434(2), ..., 434(U) and totes 436(1), 436(2), ..., 436(T) or other material handling apparatus may move within the facility 3402. For example, the user 434 may move about within the facility 3402 to pick or place the items 432 in various fixtures 430, placing them on the tote 436 for ease of transport. The tote 436 is configured to carry or otherwise transport one or more items 432. For example, the tote 436 may include a basket, cart, bag, bin, and so forth. In other implementations, other material handling apparatuses such as robots, forklifts, cranes, aerial drones, and so forth, may move about the facility 3402 picking, placing, or otherwise moving the items 432. For example, a robot may pick an item 432 from a first fixture 430(1) and move the item 432 to a second fixture 430(2).

One or more sensors 438 may be configured to acquire information in the facility 3402. The sensors 438 may include, but are not limited to, cameras 438(1), depth sensors 438(2), load cells 158, optical sensor arrays 438(13), proximity sensors 438(6), and so forth. The sensors 438 may be stationary or mobile, relative to the facility 3402. For example, as described above the shelves may contain load cells 158 to generate weight signals, cameras 438(1) to acquire images of picking or placement of items 432 on shelves, optical sensor arrays 438(13) to detect shadows of the user's 434 hands at the fixtures 430, and so forth. In another example, the facility 3402 may include a camera 438(1) to obtain images of the user 434 or other objects in the facility 3402. The sensors 438 are discussed in more detail below with regard to FIG. 35.

While the storage area 3406 is depicted as having one or more aisles 3410, fixtures 430 storing the items 432, sensors 438, and so forth, it is understood that the receiving area 3404, the transition area 3408, or other areas of the facility 3402 may be similarly equipped. Furthermore, the arrangement of the various areas within the facility 3402 is depicted functionally rather than schematically. For example, in some implementations, multiple different receiving areas 3404, storage areas 3406, and transition areas 3408 may be interspersed rather than segregated in the facility 3402.

The facility 3402 may include, or be coupled to, an inventory management system 440. The inventory management system 440 is configured to interact with users 434 or devices such as sensors 438, robots, material handling equipment, computing devices, and so forth, in one or more of the receiving area 3404, the storage area 3406, or the transition area 3408.

During operation of the facility 3402, the sensors 438 may be configured to provide sensor data, or information based on the sensor data, to the inventory management system 440. The sensor data may include image data, non-image data, weight data obtained from load cells 158, and so forth. The sensors 438 are described in more detail below with regard to FIG. 35.

The inventory management system 440 or other systems may use the sensor data to track the location of objects within the facility 3402, movement of the objects, or provide other functionality. Objects may include, but are not limited to, items 432, users 434, totes 436, and so forth. For example, a series of images acquired by the camera 438(1) may indicate removal by the user 434 of an item 432 from a particular location on the fixture 430 and placement of the item 432 on or at least partially within the tote 436.

The facility 3402 may be configured to receive different kinds of items 432 from various suppliers and to store them until a customer orders or retrieves one or more of the items 432. A general flow of items 432 through the facility 3402 is indicated by the arrows of FIG. 34. Specifically, as illustrated in this example, items 432 may be received from one or more suppliers, such as manufacturers, distributors, wholesalers, and so forth, at the receiving area 3404. In various implementations, the items 432 may include merchandise, commodities, perishables, or any suitable type of item 432, depending on the nature of the enterprise that operates the facility 3402.

Upon being received from a supplier at the receiving area 3404, the items 432 may be prepared for storage in the storage area 3406. For example, in some implementations, items 432 may be unpacked or otherwise rearranged. The inventory management system 440 may include one or more software applications executing on a computer system to provide inventory management functions. These inventory management functions may include maintaining information indicative of the type, quantity, condition, cost, location, weight, or any other suitable parameters with respect to the items 432. The items 432 may be stocked, managed, or dispensed in terms of countable units, individual units, or multiple units, such as packages, cartons, crates, pallets, or other suitable aggregations. Alternatively, some items 432, such as bulk products, commodities, and so forth, may be stored in continuous or arbitrarily divisible amounts that may not be inherently organized into countable units. Such items 432 may be managed in terms of a measurable quantity such as units of length, area, volume, weight, time, duration, or other dimensional properties characterized by units of measurement. Generally speaking, a quantity of an item 432 may refer to either a countable number of individual or aggregate units of an item 432 or a measurable amount of an item 432, as appropriate.

After arriving through the receiving area 3404, items 432 may be stored within the storage area 3406. In some implementations, like items 432 may be stored or displayed together in the fixtures 430 such as on accessories 106. In this implementation, all items 432 of a given kind are stored in one fixture 430. In other implementations, like items 432 may be stored in different fixtures 430. For example, to optimize retrieval of certain items 432 having frequent turnover within a large physical facility 3402, those items 432 may be stored in several different fixtures 430 to reduce congestion that might occur at a single fixture 430.

When a customer order specifying one or more items 432 is received, or as a user 434 progresses through the facility 3402, the corresponding items 432 may be selected or "picked" from the fixtures 430 containing those items 432. In various implementations, item picking may range from manual to completely automated picking. For example, in one implementation, a user 434 may have a list of items 432 they desire and may progress through the facility 3402 picking items 432 from fixtures 430 within the storage area 3406 and placing those items 432 into a tote 436. In other implementations, employees of the facility 3402 may pick items 432 using written or electronic pick lists derived from customer orders. These picked items 432 may be placed into the tote 436 as the employee progresses through the facility 3402.

After items 432 have been picked, the items 432 may be processed at a transition area 3408. The transition area 3408 may be any designated area within the facility 3402 where items 432 are transitioned from one location to another or from one entity to another. For example, the transition area 3408 may be a packing station within the facility 3402. When the item 432 arrives at the transition area 3408, the item 432 may be transitioned from the storage area 3406 to the packing station. Information about the transition may be maintained by the inventory management system 440.

In another example, if the items 432 are departing the facility 3402, a list of the items 432 may be obtained and used by the inventory management system 440 to transition responsibility for, or custody of, the items 432 from the facility 3402 to another entity. For example, a carrier may accept the items 432 for transport with that carrier accepting responsibility for the items 432 indicated in the list. In another example, a user 434 may purchase or rent the items 432 and remove the items 432 from the facility 3402. During use of the facility 3402, the user 434 may move about the facility 3402 to perform various tasks, such as picking or placing the items 432 in the fixtures 430.

To facilitate operation of the facility 3402, the inventory management system 440 is configured to use the sensor data including the weight data and may also use other information such as item data, physical layout data, non-weight data, and so forth, to generate interaction data 442.

The interaction data 442 may provide information about an interaction, such as a pick of an item 432 from the fixture 430, a place of an item 432 to the fixture 430, a touch made to an item 432 at the fixture 430, a gesture associated with an item 432 at the fixture 430, and so forth. The interaction data 442 may include one or more of the type of interaction, interaction location identifier indicative of where from the fixture 430 the interaction took place, item identifier, quantity change to the item 432, user identifier, and so forth. The interaction data 442 may then be used to further update the item data. For example, the quantity of items 432 on hand at a particular accessory 106 may be changed based on an interaction that picks or places one or more items 432.

The inventory management system 440 may combine or otherwise utilize data from different sensors 438 of different types, including the load cells 158. For example, weight data obtained from load cells 158 at the fixture 430 may be used in conjunction with non-weight data such as the image data to determine the interaction data 442.

Figure 35:
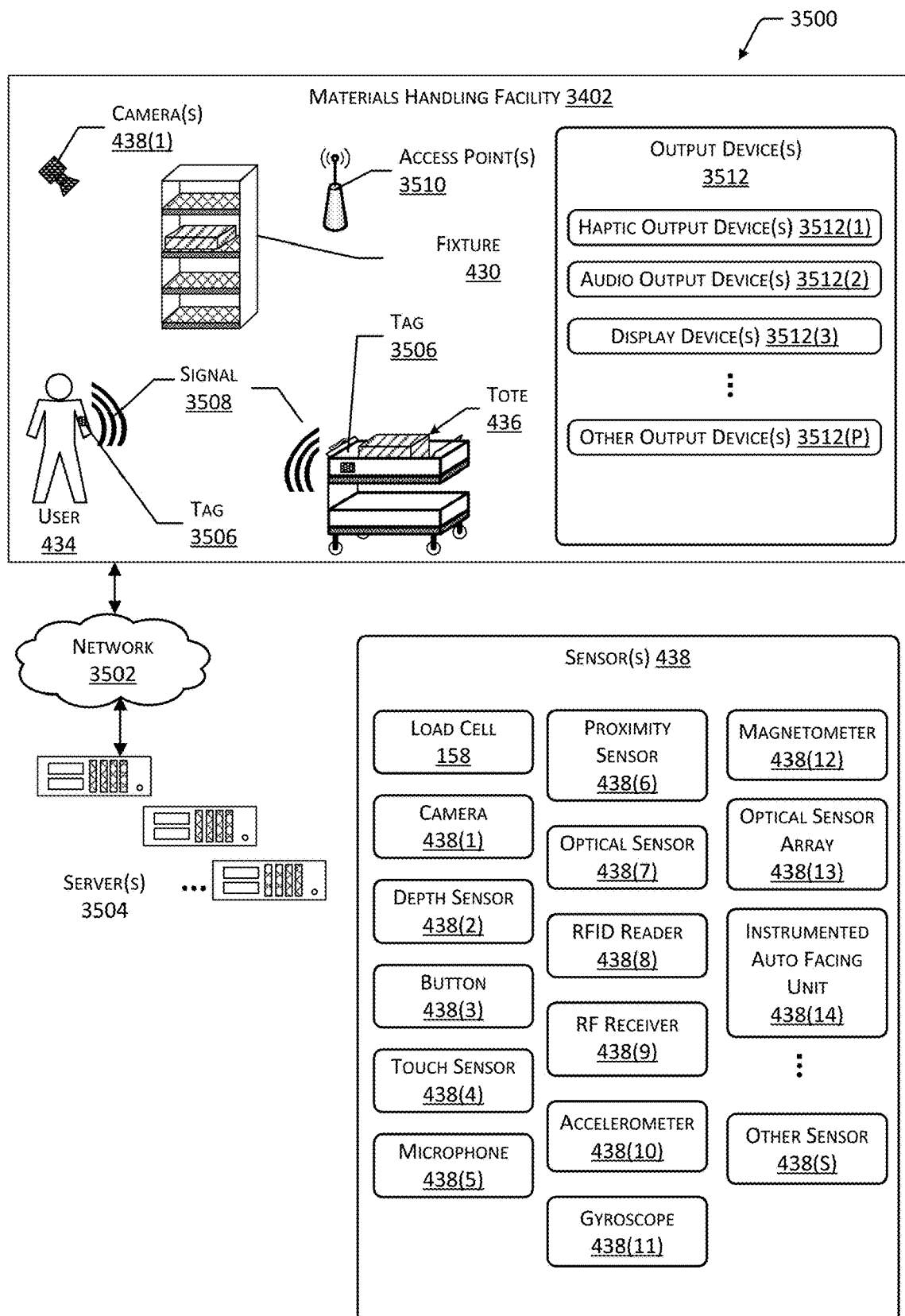
FIG. 35 is a block diagram illustrating additional details of the facility, according to some implementations.

FIG. 35 is a block diagram 3500 illustrating additional details of the facility 3402, according to some implementations. The facility 3402 may be connected to one or more networks 3502, which in turn connect to one or more servers 3504. The network 3502 may include private networks such as an institutional or personal intranet, public networks such as the Internet, or a combination thereof. The network 3502 may utilize wired technologies (e.g., wires, fiber optic cables, and so forth), wireless technologies (e.g., radio frequency, infrared, acoustic, optical, and so forth), or other connection technologies. The network 3502 is representative of any type of communication network, including one or more of data networks or voice networks.

The servers 3504 may be configured to execute one or more modules or software applications associated with the inventory management system 440 or other systems. While the servers 3504 are illustrated as being in a location outside of the facility 3402, in other implementations, at least a portion of the servers 3504 may be located at the facility 3402. The servers 3504 are discussed in more detail below with regard to FIG. 36.

The users 434, the totes 436, or other objects in the facility 3402 may be equipped with one or more tags 3506. The tags 3506 may be configured to emit a signal 3508. In one implementation, the tag 3506 may be a radio frequency identification (RFID) tag 3506 configured to emit a RF signal 3508 upon activation by an external signal. For example, the external signal may comprise a radio frequency signal or a magnetic field configured to energize or activate the RFID tag 3506. In another implementation, the tag 3506 may comprise a transmitter and a power source configured to power the transmitter. For example, the tag 3506 may comprise a Bluetooth Low Energy (BLE) transmitter and battery. In other implementations, the tag 3506 may use other techniques to indicate presence of the tag 3506. For example, an acoustic tag 3506 may be configured to generate an ultrasonic signal 3508, which is detected by corresponding acoustic receivers. In yet another implementation, the tag 3506 may be configured to emit an optical signal 3508.

The inventory management system 440 may be configured to use the tags 3506 for one or more of identification of the object, determining a location of the object, and so forth. For example, the users 434 may wear tags 3506, the totes 436 may have tags 3506 affixed, and so forth, which may be read and, based at least in part on signal strength, used to determine identity and location.

Generally, the inventory management system 440 or other systems associated with the facility 3402 may include any number and combination of input components, output components, and servers 3504.

The one or more sensors 438 (including the load cells 158) may be arranged at one or more locations within the facility 3402. For example, the sensors 438 may be mounted on or within a floor, wall, at a ceiling, at a fixture 430, on a tote 436, may be carried or worn by a user 434, and so forth.

The sensors 438 may include one or more load cells 158. The one or more load cells 158 are configured to measure the weight of a load, such as the item 432, the tote 436, or other objects. The load cells 158 may be configured to measure the weight of the load at one or more of the fixtures 430, the tote 436, on the floor of the facility 3402, and so forth. For example, the fixture 430 may include a plurality of accessories 106, with one or more load cells 158 beneath each accessory 106 to provide weight signals about an individual partitioned area or platform. The load cells 158 may include one or more sensing mechanisms to determine the weight of a load. These sensing mechanisms may include piezoresistive devices, piezoelectric devices, capacitive devices, electromagnetic devices, optical devices, potentiometric devices, microelectromechanical devices, and so forth. The sensing mechanisms of load cells 158 may operate as transducers that generate one or more signals based on an applied force, such as that of the load due to gravity. For example, the load cell 158 may comprise a strain gauge and a structural member that deforms slightly when weight is applied. The strain gauge may be bonded to or otherwise affixed to the structural member. As weight is applied, the structural member is deformed, which also results in deformation of the strain gauge. By measuring a change in the electrical characteristic of the strain gauge, such as capacitance or resistance, the weight may be determined. For example, a lookup table may relate a particular electrical resistance value to a particular weight. In another example, the load cell 158 may comprise a force sensing resistor (FSR). The FSR may comprise a resilient material that changes one or more electrical characteristics when compressed. For example, the electrical resistance of a particular portion of the FSR may decrease as the particular portion is compressed. The inventory management system 440 may use the data acquired by the load cells 158 to identify an object, determine a change in the quantity of objects, determine a location of an object, maintain shipping records, and so forth.

The sensors 438 may include one or more cameras 438(1) or other imaging sensors. The one or more cameras 438(1) may include imaging sensors configured to acquire images of a scene. The cameras 438(1) are configured to detect light in one or more wavelengths including, but not limited to, terahertz, infrared, visible, ultraviolet, and so forth. The one or more cameras 438(1) may comprise charge coupled devices (CCD), complementary metal oxide semiconductor (CMOS) devices, microbolometers, and so forth. The inventory management system 440 may use image data acquired by the one or more cameras 438(1) during operation of the facility 3402. For example, the inventory management system 440 may identify items 432, users 434, totes 436, and so forth, based at least in part on their appearance within the image data acquired by the one or more cameras 438(1). The one or more cameras 438(1) may be mounted in various locations within the facility 3402. For example, a camera 438(1) may be mounted overhead, on fixtures 430, may be worn or carried by users 434, may be affixed to totes 436, and so forth.

One or more depth sensors 438(2) may also be included in the sensors 438. The depth sensors 438(2) are configured to acquire spatial or three-dimensional (3D) data, such as depth information, about objects within a field of view. The depth sensors 438(2) may include range cameras, lidar systems, sonar systems, radar systems, structured light systems, stereo vision systems, optical interferometry systems, and so forth. The inventory management system 440 may use the 3D data acquired by the depth sensors 438(2) to identify objects, determine a location of an object in 3D real space, and so forth.

One or more buttons 438(3) may be configured to accept input from the user 434. The buttons 438(3) may comprise mechanical, capacitive, optical, or other mechanisms. For example, the buttons 438(3) may comprise mechanical switches configured to accept an applied force from a touch of the user 434 to generate an input signal. The inventory management system 440 may use data from the buttons 438(3) to receive information from the user 434. For example, the tote 436 may be configured with a button 438(3) to accept input from the user 434 and send information indicative of the input to the inventory management system 440.

The sensors 438 may include one or more touch sensors 438(4). The touch sensors 438(4) may use resistive, capacitive, surface capacitance, projected capacitance, mutual capacitance, optical, Interpolating Force-Sensitive Resistance (IFSR), or other mechanisms to determine the position of a touch or near-touch. For example, the IFSR may comprise a material configured to change electrical resistance responsive to an applied force. The location within the material of that change in electrical resistance may indicate the position of the touch. The inventory management system 440 may use data from the touch sensors 438(4) to receive information from the user 434. For example, the touch sensor 438(4) may be integrated with the tote 436 to provide a touchscreen with which the user 434 may select from a menu one or more particular items 432 for picking, enter a manual count of items 432 at a fixture 430, and so forth.

One or more microphones 438(5) may be configured to acquire information indicative of sound present in the environment. In some implementations, arrays of microphones 438(5) may be used. These arrays may implement beamforming techniques to provide for directionality of gain. The inventory management system 440 may use the one or more microphones 438(5) to acquire information from acoustic tags 3506, accept voice input from the users 434, determine ambient noise level, and so forth.

The sensors 438 may include proximity sensors 438(6) used to determine presence of an object, such as the user 434, the tote 436, and so forth. The proximity sensors 438(6) may use optical, electrical, ultrasonic, electromagnetic, or other techniques to determine a presence of an object. In some implementations, the proximity sensors 438(6) may use an optical emitter and an optical detector to determine proximity. For example, an optical emitter may emit light, a portion of which may then be reflected by the object back to the optical detector to provide an indication that the object is proximate to the proximity sensor 438(6). In other implementations, the proximity sensors 438(6) may comprise a capacitive proximity sensor 438(6) configured to provide an electrical field and determine a change in electrical capacitance due to the presence or absence of an object within the electrical field.

The proximity sensors 438(6) may be configured to provide sensor data indicative of one or more of a presence or absence of an object, a distance to the object, or characteristics of the object. An optical proximity sensor 438(6) may use time-of-flight (ToF), structured light, interferometry, or other techniques to generate the distance data. For example, ToF determines a propagation time (or "round-trip" time) of a pulse of emitted light from an optical emitter or illuminator that is reflected or otherwise returned to an optical detector. By dividing the propagation time in half and multiplying the result by the speed of light in air, the distance to an object may be determined. In another implementation, a structured light pattern may be provided by the optical emitter. A portion of the structured light pattern may then be detected on the object using a sensor 438 such as a camera 438(1). Based on an apparent distance between the features of the structured light pattern, the distance to the object may be calculated. Other techniques may also be used to determine distance to the object. In another example, the color of the reflected light may be used to characterize the object, such as skin, clothing, tote 436, and so forth.

The sensors 438 may include one or more optical sensors 438(7). The optical sensors 438(7) may be configured to provide data indicative of one or more of color or intensity of light impinging thereupon. For example, the optical sensor 438(7) may comprise a photodiode and associated circuitry configured to generate a signal or data indicative of an incident flux of photons. As described below, the optical sensor array 438(13) may comprise a plurality of the optical sensors 438(7). For example, the optical sensor array 438 (13) may comprise an array of ambient light sensors such as the ISL76683 as provided by Intersil Corporation of Milpitas, Calif., USA, or the MAX44009 as provided by Maxim Integrated of San Jose, Calif., USA. In other implementations, other optical sensors 438(7) may be used. The optical sensors 438(7) may be sensitive to one or more of infrared light, visible light, or ultraviolet light. For example, the optical sensors 438(7) may be sensitive to infrared light, and infrared light sources such as LEDs may provide illumination.

The optical sensors 438(7) may include photodiodes, photoresistors, photovoltaic cells, quantum dot photoconductors, bolometers, pyroelectric infrared detectors, and so forth. For example, the optical sensor 438(7) may use germanium photodiodes to detect infrared light.

One or more radio frequency identification (RFID) readers 438(8), near field communication (NFC) systems, and so forth, may be included as sensors 438. For example, the RFID readers 438(8) may be configured to read the RF tags 3506. Information acquired by the RFID reader 438(8) may be used by the inventory management system 440 to identify an object associated with the RF tag 3506 such as the item 432, the user 434, the tote 436, and so forth. For example, based on information from the RFID readers 438(8) detecting the RF tag 3506 at different times and RFID readers 438(8) having different locations in the facility 3402, a velocity of the RF tag 3506 may be determined.

One or more RF receivers 438(9) may also be included as sensors 438. In some implementations, the RF receivers 438(9) may be part of transceiver assemblies. The RF receivers 438(9) may be configured to acquire RF signals 3508 associated with Wi-Fi, Bluetooth, ZigBee, 2G, 34G, 4G, LTE, or other wireless data transmission technologies. In some implementations, the RF receivers 438(9) may detect signals transmitted at frequencies such as below 15 MHz. The RF receivers 438(9) may provide information associated with data transmitted via radio frequencies, signal strength of RF signals 3508, and so forth. For example, information from the RF receivers 438(9) may be used by the inventory management system 440 to determine a location of an RF source, such as a communication interface onboard the tote 436.

The sensors 438 may include one or more accelerometers 438(10), which may be worn or carried by the user 434, mounted to the tote 436, and so forth. The accelerometers 438(10) may provide information such as the direction and magnitude of an imposed acceleration. Data such as rate of acceleration, determination of changes in direction, speed, and so forth, may be determined using the accelerometers 438(10).

A gyroscope 438(11) may provide information indicative of rotation of an object affixed thereto. For example, the tote 436 or other objects may be equipped with a gyroscope 438(11) to provide data indicative of a change in orientation of the object.

A magnetometer 438(12) may be used to determine an orientation by measuring ambient magnetic fields, such as the terrestrial magnetic field. The magnetometer 438(12) may be worn or carried by the user 434, mounted to the tote 436, and so forth. For example, the magnetometer 438(12) mounted to the tote 436 may act as a compass and provide information indicative of which direction the tote 436 is oriented.

An optical sensor array 438(13) may comprise one or optical sensors 438(7). The optical sensors 438(7) may be arranged in a regular, repeating, or periodic two-dimensional arrangement such as a grid. The optical sensor array 438(13) may generate image data. For example, the optical sensor array 438(13) may be arranged within or below a fixture 430 and obtain information about shadows of items 432, hand of the user 434, and so forth.

The sensors 438 may include other sensors 438(S) as well. For example, the other sensors 438(S) may include light curtains, ultrasonic rangefinders, thermometers, barometric sensors, hygrometers, and so forth. For example, the inventory management system 440 may use information acquired from thermometers and hygrometers in the facility 3402 to direct the user 434 to check on delicate items 432 stored in a particular fixture 430, which is overheating, too dry, too damp, and so forth.

In one implementation, a light curtain may utilize a linear array of light emitters and a corresponding linear array of light detectors. For example, the light emitters may comprise a line of infrared light emitting diodes (LEDs) or vertical cavity surface emitting lasers (VCSELs) that are arranged above a top shelf in front of the fixture 430, while the light detectors comprise a line of photodiodes sensitive to infrared light arranged below the light emitters. The light emitters produce a "lightplane" or sheet of infrared light that is then detected by the light detectors. An object passing through the lightplane may decrease the amount of light falling upon the light detectors. For example, the user's 434 hand would prevent at least some of the light from light emitters from reaching a corresponding light detector. As a result, a position along the linear array of the object may be determined that is indicative of a touchpoint. This position may be expressed as touchpoint data, with the touchpoint being indicative of the intersection between the hand of the user 434 and the sheet of infrared light. In some implementations, a pair of light curtains may be arranged at right angles relative to one another to provide two-dimensional touchpoint data indicative of a position of touch in a plane. Input from the light curtain, such as indicating occlusion from a hand of a user 434 may be used to trigger acquisition or selection of image data for processing by an analysis module.

The sensors 438 may also include an instrumented autofacing unit (AFU) 438(14). The instrumented AFU 438(14) may comprise a position sensor configured to provide data indicative of displacement of a pusher. As an item 432 is removed from the instrumented AFU 438(14), the pusher moves, such as under the influence of a spring, and pushes the remaining items 432 in the instrumented AFU 438(14) to the front of the fixture 430. By using data from the position sensor, and given item data such as a depth of an individual item 432, a count may be determined, based on a change in position data. For example, if each item 432 is 1 inch deep, and the position data indicates a change of 4 inches, the quantity held by the instrumented AFU 438(14) may have changed by 4 items 432. This count information may be used to confirm or provide a cross check for a count obtained by other means, such as analysis of the image data.

In some implementations, the camera 438(1) or other sensors 438(S) may include hardware processors, memory, and other elements configured to perform various functions. For example, the camera 438(1) may be configured to generate image data, send the image data to another device such as the server 3504, and so forth.

The facility 3402 may include one or more access points 3510 configured to establish one or more wireless networks. The access points 3510 may use Wi-Fi, NFC, Bluetooth, or other technologies to establish wireless communications between a device and the network 3502. The wireless networks allow the devices to communicate with one or more of the sensors 438, the inventory management system 440, the optical sensor arrays 438(13), the tag 3506, a communication device of the tote 436, or other devices.

Output devices 3512 may also be provided in the facility 3402. The output devices 3512 are configured to generate signals, which may be perceived by the user 434 or detected by the sensors 438. In some implementations, the output devices 3512 may be used to provide illumination of the optical sensor array 438(13).

Haptic output devices 3512(1) are configured to provide a signal that results in a tactile sensation to the user 434. The haptic output devices 3512(1) may use one or more mechanisms such as electrical stimulation or mechanical displacement to provide the signal. For example, the haptic output devices 3512(1) may be configured to generate a modulated electrical signal, which produces an apparent tactile sensation in one or more fingers of the user 434. In another example, the haptic output devices 3512(1) may comprise piezoelectric or rotary motor devices configured to provide a vibration, which may be felt by the user 434.

One or more audio output devices 3512(2) may be configured to provide acoustic output. The acoustic output includes one or more of infrasonic sound, audible sound, or ultrasonic sound. The audio output devices 3512(2) may use one or more mechanisms to generate the acoustic output. These mechanisms may include, but are not limited to, the following: voice coils, piezoelectric elements, magnetostrictive elements, electrostatic elements, and so forth. For example, a piezoelectric buzzer or a speaker may be used to provide acoustic output.

The display devices 3512(3) may be configured to provide output, which may be seen by the user 434 or detected by a light-sensitive sensor such as a camera 438(1) or an optical sensor 438(7). In some implementations, the display devices 3512(3) may be configured to produce output in one or more of infrared, visible, or ultraviolet light. The output may be monochrome or in color. The display devices 3512(3) may be one or more of emissive, reflective, microelectromechanical, and so forth. An emissive display device 3512(3), such as using LEDs, is configured to emit light during operation. In comparison, a reflective display device 3512(3), such as using an electrophoretic element, relies on ambient light to present an image. Backlights or front lights may be used to illuminate non-emissive display devices 3512(3) to provide visibility of the output in conditions where the ambient light levels are low.

The display devices 3512(3) may be located at various points within the facility 3402. For example, the addressable displays may be located on fixtures 430, totes 436, on the floor of the facility 3402, and so forth.

Other output devices 3512(P) may also be present. For example, the other output devices 3512(P) may include scent/odor dispensers, document printers, 3D printers or fabrication equipment, and so forth.

Figure 36:
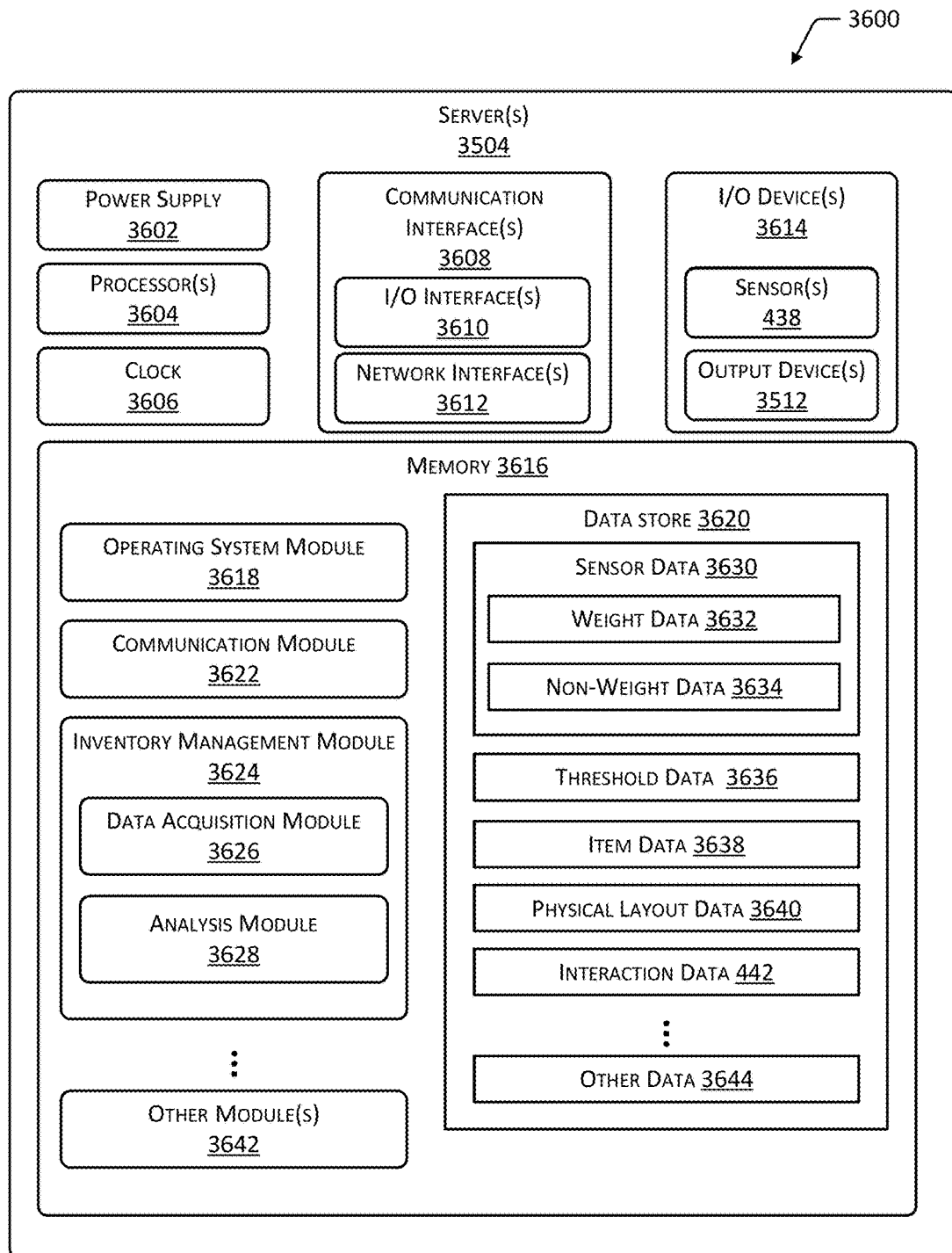
FIG. 36 is a block diagram of a server to support operation of the facility, according to some implementations.

FIG. 36 illustrates a block diagram 3600 of a server 3504 configured to support operation of the facility 3402, according to some implementations. The server 3504 may be physically present at the facility 3402, may be accessible by the network 3502, or a combination of both. The server 3504 does not require end-user knowledge of the physical location and configuration of the system that delivers the services. Common expressions associated with the server 3504 may include "on-demand computing", "software as a service (SaaS)", "platform computing", "network-accessible platform", "cloud services", "data centers", and so forth. Services provided by the server 3504 may be distributed across one or more physical or virtual devices.

One or more power supplies 3602 may be configured to provide electrical power suitable for operating the components in the server 3504. The one or more power supplies 3602 may comprise batteries, capacitors, fuel cells, photovoltaic cells, wireless power receivers, conductive couplings suitable for attachment to an external power source such as provided by an electric utility, and so forth. The server 3504 may include one or more hardware processors 3604 (processors) configured to execute one or more stored instructions. The processors 3604 may comprise one or more cores. One or more clocks 3606 may provide information indicative of date, time, ticks, and so forth. For example, the processor 3604 may use data from the clock 3606 to associate a particular interaction with a particular point in time.

The server 3504 may include one or more communication interfaces 3608 such as input/output (I/O) interfaces 3610, network interfaces 3612, and so forth. The communication interfaces 3608 enable the server 3504, or components thereof, to communicate with other devices or components. The communication interfaces 3608 may include one or more I/O interfaces 3610. The I/O interfaces 3610 may comprise Inter-Integrated Circuit (I2C), Serial Peripheral Interface bus (SPI), Universal Serial Bus (USB) as promulgated by the USB Implementers Forum, RS-232, and so forth.

The I/O interface(s) 3610 may couple to one or more I/O devices 3614. The I/O devices 3614 may include input devices such as one or more of a sensor 438, keyboard, mouse, scanner, and so forth. The I/O devices 3614 may also include output devices 3512 such as one or more of a display device 3512(3), printer, audio speakers, and so forth. In some embodiments, the I/O devices 3614 may be physically incorporated with the server 3504 or may be externally placed.

The network interfaces 3612 may be configured to provide communications between the server 3504 and other devices, such as the totes 436, routers, access points 3510, and so forth. The network interfaces 3612 may include devices configured to couple to personal area networks (PANs), local area networks (LANs), wireless local area networks (WLANS), wide area networks (WANs), and so forth. For example, the network interfaces 3612 may include devices compatible with Ethernet, Wi-Fi, Bluetooth, ZigBee, and so forth.

The server 3504 may also include one or more busses or other internal communications hardware or software that allow for the transfer of data between the various modules and components of the server 3504.

As shown in FIG. 36, the server 3504 includes one or more memories 3616. The memory 3616 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 3616 provides storage of computer-readable instructions, data structures, program modules, and other data for the operation of the server 3504. A few example functional modules are shown stored in the memory 3616, although the same functionality may alternatively be implemented in hardware, firmware, or as a system on a chip (SoC).

The memory 3616 may include at least one operating system (OS) module 3618. The OS module 3618 is configured to manage hardware resource devices such as the I/O interfaces 3610, the I/O devices 3614, the communication interfaces 3608, and provide various services to applications or modules executing on the processors 3604. The OS module 3618 may implement a variant of the FreeBSD operating system as promulgated by the FreeBSD Project; other UNIX or UNIX-like variants; a variation of the Linux operating system as promulgated by Linus Torvalds; the Windows operating system from Microsoft Corporation of Redmond, Wash., USA; and so forth.

Also stored in the memory 3616 may be a data store 3620 and one or more of the following modules. These modules may be executed as foreground applications, background tasks, daemons, and so forth. The data store 3620 may use a flat file, database, linked list, tree, executable code, script, or other data structure to store information. In some implementations, the data store 3620 or a portion of the data store 3620 may be distributed across one or more other devices including the servers 3504, network attached storage devices, and so forth.

A communication module 3622 may be configured to establish communications with one or more of the totes 436, sensors 438, display devices 3512(3), other servers 3504, or other devices. The communications may be authenticated, encrypted, and so forth.

The memory 3616 may store an inventory management module 3624. The inventory management module 3624 is configured to provide the inventory functions as described herein with regard to the inventory management system 440. For example, the inventory management module 3624 may track items 432 between different fixtures 430, to and from the totes 436, and so forth. The inventory management module 3624 may access sensor data 3630. The sensor data 3630 may include the weight data 3632, non-weight data 3634, such as obtained from other sensors 438 such as cameras 438(1), depth sensors 438(2), and so forth.

The inventory management module 3624 may include one or more of a data acquisition module 3626 and an analysis module 3628. The data acquisition module 3626 may be configured to acquire and access information associated with operation of the facility 3402. For example, the data acquisition module 3626 may be configured to acquire the sensor data 3630, such as the weight data 3632, the non-weight data 3634 such as the image data, and so forth.

The analysis module 3628 is configured to process other sensor data 3630 to determine interaction data 442. The sensor data 3630 may include weight data 3632 obtained from the load cells 158 and non-weight data 3634 obtained from other sensors, such as image data from cameras 438(1), depth sensor data from the depth sensors 438(2), data from instrumented auto facing units 438(14) and so forth.

Threshold data 3636 may specify one or more thresholds used by the analysis module 3628 to determine changes in a quantity of items 432 at a particular accessory 106. For example, the threshold data 3636 may specify a minimum variance in weight that is indicative of a change in quantity of items 432 at a particular accessory 106.

The inventory management system 440 may maintain and utilize item data 3638 and physical layout data 3640. The item data 3638 comprises information about a particular type of item 432. The item data 3638 may include information indicative of a weight of a single item 432, or a package, kit, or other grouping considered to be a single item 432. The item data 3638 may include other characteristics of that type of item 432 such as: physical dimensions, characteristics about how the item 432 appears, and so forth. For example, the item data 3638 may comprise a plurality of local descriptor values generated by feature extraction algorithms, parameters for classifiers, neural network configuration data, and so forth, that characterizes the appearance of a representative one or more of the item 432. The item data 3638 may indicate the types and quantities of items 432 that are expected to be stored at that particular fixture 430, such as in a particular accessory 106 on a fixture 430. The item data 3638 may include other data. For example, the other data may comprise weight distribution of the item 432, point cloud data for the item 432, and so forth.

The physical layout data 3640 may provide information indicative of where fixtures 430 are in the facility, location of sensors, information about sensor orientation and field of view (where applicable), and so forth. For example, the physical layout data 3640 may comprise information representative of a map or floor plan of the facility with relative positions of fixtures 430, planogram data indicative of how types of items 432 are to be arranged at the fixtures 430, and so forth. In another example, the physical layout data 3640 may comprise information indicating the particular placement of load cells 158 on a particular fixture 430.

The interaction data 442 provides information about an interaction, such as a pick of an item 432 from the fixture 430, a place of an item 432 to the fixture 430, a touch made to an item 432 at the fixture 430, a gesture associated with an item 432 at the fixture 430, and so forth. The interaction data 442 may include one or more of the type of interaction, interaction location identifier indicative of the fixture 430 at which the interaction took place, an item identifier indicative of a type of item 432 or particular item 432, quantity change to the item 432, user identifier, and so forth. The interaction data 442 may then be used to further update the item data 3638. For example, the quantity of items 432 on hand at a particular partitioned area on the fixture 430 may be changed based on an interaction that picks or places one or more items 432.

Processing of image data may be performed by an image processing module implementing, at least in part, one or more of the following tools or techniques. In one implementation, processing of the image data may be performed, at least in part, using one or more tools available in the OpenCV library as developed by Intel Corporation of Santa Clara, Calif., USA; Willow Garage of Menlo Park, Calif., USA; and Itseez of Nizhny Novgorod, Russia, with information available at www.opencv.org. In another implementation, functions available in the OKAO machine vision library as promulgated by Omron Corporation of Kyoto, Japan, may be used to process the image data. In still another implementation, functions such as those in the Machine Vision Toolbox for Matlab (MVTB) available using MATLAB as developed by Math Works, Inc. of Natick, Mass., USA, may be utilized.

Techniques such as artificial neural networks (ANNs), active appearance models (AAMs), active shape models (ASMs), principal component analysis (PCA), cascade classifiers, and so forth, may also be used to process the sensor data 3630 or other data. For example, the ANN may be trained using a supervised learning algorithm such that object identifiers are associated with images of particular objects within training images provided to the ANN. Once trained, the ANN may be provided with the sensor data 3630 to determine similarity between two or more images, provide object identification, and so forth.

Other modules 3642 may also be present in the memory 3616 as well as other data 3644 in the data store 3620. For example, the other modules 3642 may include an accounting module while the other data 3644 may include billing data. The accounting module may be configured to assess charges to an account associated with a particular user 434 or other entities, while the billing data may include information such as payment account numbers.

The processes discussed herein may be implemented in hardware, software, or a combination thereof. In the context of software, the described operations represent computer-executable instructions stored on one or more non-transitory computer-readable storage media that, when executed by one or more processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques and devices described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A system comprising:
a crossbar comprising:
  a left bracket attached to a left end of the crossbar and a right bracket attached to a right end of the crossbar; and
  a plurality of electrical conductors; and
a weighing module attached to the crossbar, wherein the weighing module comprises:
  a first member;
  one or more module engagement features for the weighing module to mechanically engage at least a portion of the crossbar;
  a load cell having a first end attached to the first member;
  electronics to generate load cell data indicative of weight on the load cell;
  a plurality of electrical contacts to establish a connection between the electronics and the plurality of electrical conductors of the crossbar;
  a mounting block affixed to a second end of the load cell; and
  a bin that is affixed to the mounting block using one or more removeable fasteners.

2. A system comprising:
a crossbar comprising a plurality of electrical conductors; and
a first weighing module attached to the crossbar, wherein the first weighing module comprises:
  a first member;
  one or more module engagement features to mechanically engage at least a portion of the crossbar;
  a first load cell having a first end attached to the first member;
  first electronics to generate first load cell data indicative of weight on the first load cell; and
  a first plurality of electrical contacts to establish a connection between the first electronics and the plurality of electrical conductors of the crossbar; and
an accessory removably mounted to a second end of the first load cell.

3. The system of claim 2, wherein the one or more module engagement features comprise one or more of threaded bolts, threaded screws, or rivets.

4. The system of claim 2, wherein the accessory is removably mounted to the second end of the first load cell using one or more of bolts or threaded screws.

5. The system of claim 2, further comprising:
an accessory bracket comprising:
  a first portion affixed to the second end of the first load cell; and
  a second portion that is arranged perpendicular to the first portion; and
the accessory comprising one or more of:
  a shelf affixed to the second portion of the accessory bracket, or
  a hanger affixed to the second portion of the accessory bracket.

6. The system of claim 2, further comprising:
an accessory bracket affixed to the second end of the first load cell, the accessory bracket comprising a stiffening feature; and a front plate mounted to the accessory bracket proximate to the stiffening feature, wherein the front plate comprises one or more holes to accept a hanger.

7. The system of claim 2, further comprising a second weighing module, wherein the second weighing module comprises:
one or more second module engagement features to mechanically engage at least a portion of the crossbar;
a second load cell having a third end attached to a third second member;
second electronics to generate second load cell data indicative of weight on the second load cell;
a second plurality of electrical contacts to establish a connection between the second electronics and the plurality of electrical conductors of the crossbar; and
wherein the accessory is also mounted to a fourth end of the second load cell using one or more removeable fasteners, the mounting between the fourth end and the second load cell configured to provide vertical support to the accessory while allowing lateral movement.

8. The system of claim 7, further comprising:
a first accessory mounting block affixed to the second end of the first load cell and the accessory; and
a second accessory mounting block affixed to the fourth end of the second load cell and the accessory.

9. The system of claim 2, wherein the accessory comprises a single piece of formed material, and further wherein at least a portion of the accessory comprises a rear cap wall, a top cap wall, and a front cap wall that provide a concave region within which at least part of the first load cell is arranged.

10. The system of claim 2, further comprising:
a mounting bracket that attaches with a first end of the mounting bracket to the second end of the first load cell; and
the accessory comprising one or more of a tray or hanger that attaches to a second end of the mounting bracket.

11. The system of claim 2, wherein an underside of the accessory is located above an upper surface of the first load cell.

12. The system of claim 2, wherein the second end of the first load cell is affixed to a first end of the accessory and further wherein a second end of the accessory is unsupported.

13. The system of claim 2, the accessory comprising:
a shelf having a front end and a back end, wherein the back end is affixed to the second end of the first load cell and the front end is distal to the crossbar.

14. The system of claim 2, wherein the accessory comprises:
a first portion that attaches to the second end of the first load cell; and
a second portion arranged substantially vertically and comprising a flat surface having one or more holes therein that are configured to accept a hanger.

15. A system comprising:
a bracket comprising:
a bracket body;
an upper engagement tab extending from an upper portion of a first end of the bracket body, the upper engagement tab comprising:
a first notch positioned proximal to the bracket body; and
a second notch positioned distal to the bracket body; and
a lower engagement tab extending from a lower portion of the first end of the bracket body, the lower engagement tab comprising:
a third notch positioned proximal to the bracket body; and
a distal surface;
a crossbar attached to the bracket; and
a weighing module attached to the crossbar via an engagement feature.

16. The system of claim 15, wherein an interior proximal surface of the second notch and an interior proximal surface of the third notch are collinear.

17. The system of claim 15, wherein the second notch and the third notch are aligned with one another.

18. The system of claim 15, wherein an interior proximal surface of the first notch is aligned with the distal surface.

19. The system of claim 15, the crossbar comprising a plurality of electrical conductors; and
the weighing module comprising:
a load cell;
electronics to generate load cell data indicative of weight on the load cell; and
a plurality of electrical contacts to establish a connection between the electronics and the plurality of electrical conductors of the crossbar.

20. The system of claim 15, the crossbar comprising:
a plurality of engagement slots in a member, each engagement slot having a long axis that is perpendicular to a long axis of the crossbar; and
a plurality of linear electrical contacts, each linear electrical contact having a long axis that is parallel to the long axis of the crossbar.

* * * * *